(12) United States Patent
Wu et al.

(10) Patent No.: US 12,402,522 B2
(45) Date of Patent: Aug. 26, 2025

(54) FLEXIBLE DISPLAY APPARATUS

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 522 days.

(21) Appl. No.: 17/879,804

(22) Filed: Aug. 3, 2022

(65) Prior Publication Data
US 2023/0060493 A1 Mar. 2, 2023

(30) Foreign Application Priority Data
Sep. 2, 2021 (CN) .......................... 202111026199.1

(51) Int. Cl.
*H10K 77/10* (2023.01)
*H10K 59/12* (2023.01)
*H10K 59/40* (2023.01)
*H10K 59/65* (2023.01)
*H10K 102/00* (2023.01)

(52) U.S. Cl.
CPC ........... *H10K 77/111* (2023.02); *H10K 59/12* (2023.02); *H10K 59/40* (2023.02); *H10K 59/65* (2023.02); *H10K 2102/311* (2023.02)

(58) Field of Classification Search
CPC ...... H10K 77/111; H10K 59/12; H10K 59/40; H10K 59/65; H10K 2102/311; G06F 2203/04102; G06F 2203/04103; G06F 2203/04106; G06F 1/1637; G06F 1/1641; G06F 1/1643; G06F 3/0412; G06F 3/044; G06F 3/0446; G06F 3/046; G06F 1/1652; H04M 2250/22; H04M 1/0268; G09F 9/301
See application file for complete search history.

(56) References Cited

U.S. PATENT DOCUMENTS 10,642,313 B1 * 5/2020 Wu ...................... G06V 40/1306
2023/0006173 A1 * 1/2023 Kim ...................... G06F 1/1652

FOREIGN PATENT DOCUMENTS

TW   202121136 A   6/2021
TW   202125863 A   7/2021

* cited by examiner

Primary Examiner — J. E. Schoenholtz
(74) Attorney, Agent, or Firm — Winston Hsu

(57) ABSTRACT

A flexible display apparatus includes a display module, a metal plate and a sensor. The display module has a flexible area. The metal plate is disposed under the display module, and the metal plate includes a patterned portion overlapped with the flexible area. The sensor has a sensing layer disposed at a first side of the metal plate close to the display module and a sensing driving component electrically connected to the sensing layer and disposed at a second side of the metal plate opposite to the first side.

18 Claims, 20 Drawing Sheets

FLEXIBLE DISPLAY APPARATUS

BACKGROUND OF THE DISCLOSURE

1. Field of the Disclosure

The present disclosure relates to a flexible display apparatus, and more particularly to a flexible display apparatus having a sensor.

2. Description of the Prior Art

Nowadays, a flexible display apparatus is an electronic product in the new generation, and thus, the requirement of the flexible display apparatus is enhanced correspondingly. In order to make the flexible display apparatus more convenient to use, the industry is committed to deploying sensor(s) in the flexible display apparatus, such as a touch sensor, a pen sensor and/or a fingerprint sensor. In the design of the flexible display apparatus, it should be considered whether the flexible, bending and/or rollable area of the flexible display apparatus would affect yield, reliability, breakdown possibility and other factor (s) of the sensor. Accordingly, it is an important issue of producing a high-quality flexible display apparatus with the sensor.

SUMMARY OF THE DISCLOSURE

According to an embodiment, the present disclosure provides a flexible display apparatus including a display module, a metal plate and a sensor. The display module has a flexible area. The metal plate is disposed under the display module, and the metal plate includes a patterned portion overlapped with the flexible area. The sensor has a sensing layer disposed at a first side of the metal plate close to the display module and a sensing driving component electrically connected to the sensing layer and disposed at a second side of the metal plate opposite to the first side.

DETAILED DESCRIPTION

Figure 1:
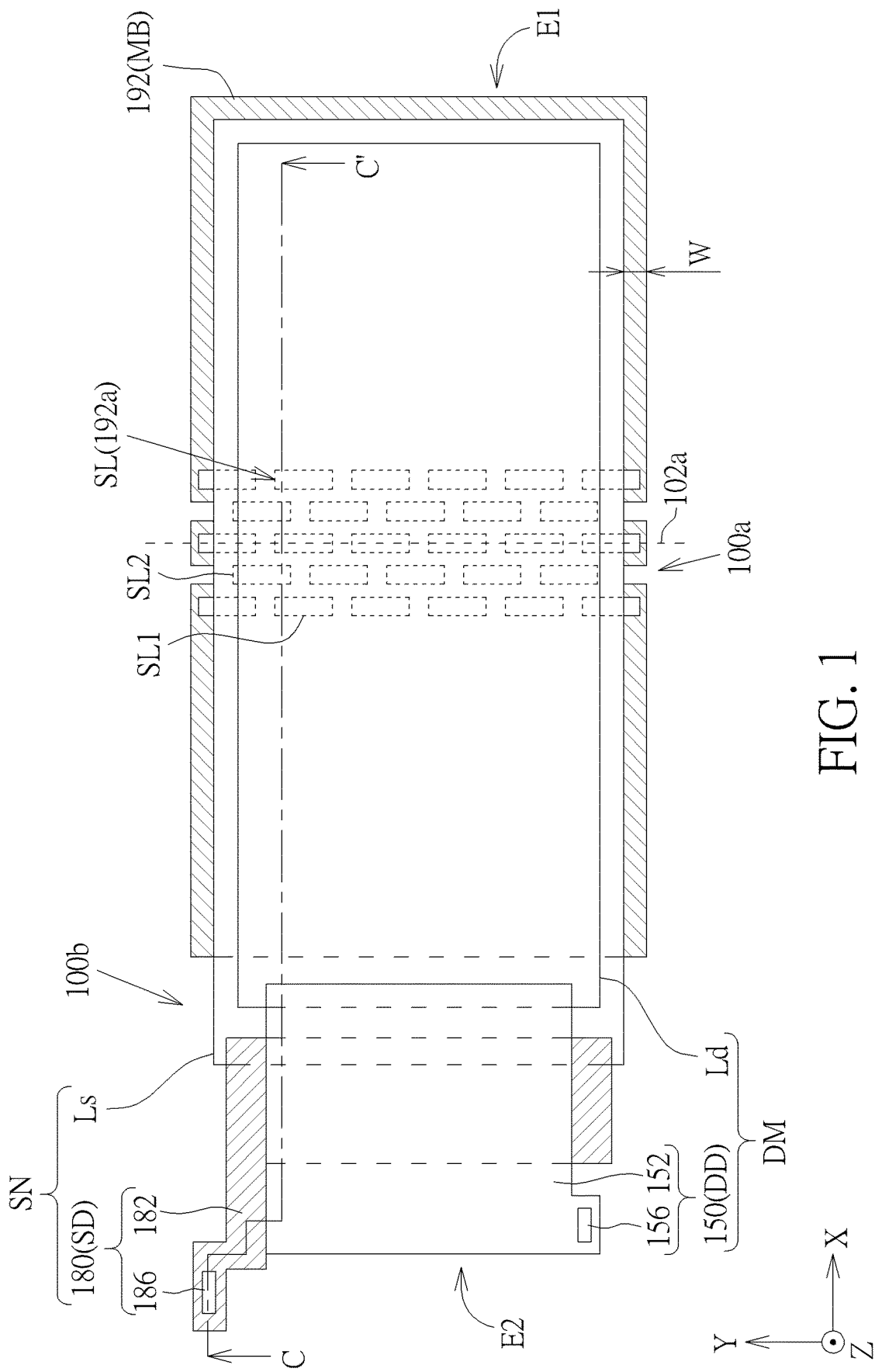
FIG. 1 is a schematic diagram showing a top view of a flexible display apparatus according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of a flexible display apparatus in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component (s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view/vertical direction, the corresponding component may be below or above the another component, and the disposition relationship along the top-view/vertical direction are determined by an orientation of the device.

It will be understood that when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the description and following claims, it should be noted that the term "overlap" means that two elements overlap along the top-view/vertical direction. In the description and following claims, the term "parallel" means that an angle between two elements is less than or equal to the specific degree(s), such as 5 degrees, 3 degrees or 1 degree.

In the present disclosure, the flexible display apparatus includes a display function and a sensing function, and the flexible display apparatus may optionally an antenna function, other suitable function(s) or a combination thereof, but not limited thereto. In some embodiments, the flexible display apparatus may include a tiled device, but not limited thereto. The light emitting device of the present disclosure may be a self-luminous type display device. For example, the flexible display apparatus may include an organic light-emitting diode (OLED), an inorganic light-emitting diode (LED) such as a micro-LED and/or a mini-LED, quantum dots (QDs) material, a quantum-dot light-emitting diode (QLED, QDLED), fluorescence material, phosphor material, other suitable material(s) or a combination thereof, but not limited thereto. Moreover, the flexible display apparatus may be a color display device or a monochrome display device, and a shape of the flexible display apparatus may be a rectangle, a circle, a polygon, a shape having a curved edge or other suitable shape, but not limited thereto.

The flexible display apparatus may include a plurality of pixels, and the pixel may include at least one sub-pixel. In some embodiments, if the flexible display apparatus is a color display device, one pixel may include three sub-pixels for instance, such as a green sub-pixel, a red sub-pixel and a blue sub-pixel, but not limited thereto. The number and color of the sub-pixel(s) included in the pixel may be adjusted based on requirement(s). In some embodiments, if the flexible display apparatus is a monochrome display device, one pixel may include one sub-pixel for instance, but not limited thereto. The number of the pixels, the arrangement of the pixels, the number of the sub-pixels and the arrangement of the sub-pixels may be adjusted based on requirement(s). For example, the sub-pixels may be arranged in matrix, stripe type, staggered type or any other suitable arrangement. In addition, the top-view shape of a light emitting portion of the sub-pixel may be a rectangle, a parallelogram, a chevron, a shape having a curved edge or other suitable shape. The top-view shape of the light emitting portion of the sub-pixel may be determined by an opening of a light shielding layer.

In the following, in order to explain exemplarily, the flexible display apparatus is a color display device having light-emitting diodes (e.g., organic light-emitting diodes, inorganic light-emitting diodes or quantum-dot light-emitting diodes) as an example, but the flexible display apparatus is not limited thereto. Note that "the flexible display apparatus" of the present disclosure means that the displace device has at least one flexible area, wherein each flexible area may be at least a portion of the flexible display apparatus, and the flexible display apparatus can be can be flexed, curled, folded or rolled (these actions will be referred as "bend" or "bent" in the following) in the flexible area. For example, the flexible display apparatus may be a foldable display device, a stretchable display device or a rollable display device, but not limited thereto.

Figure 2:
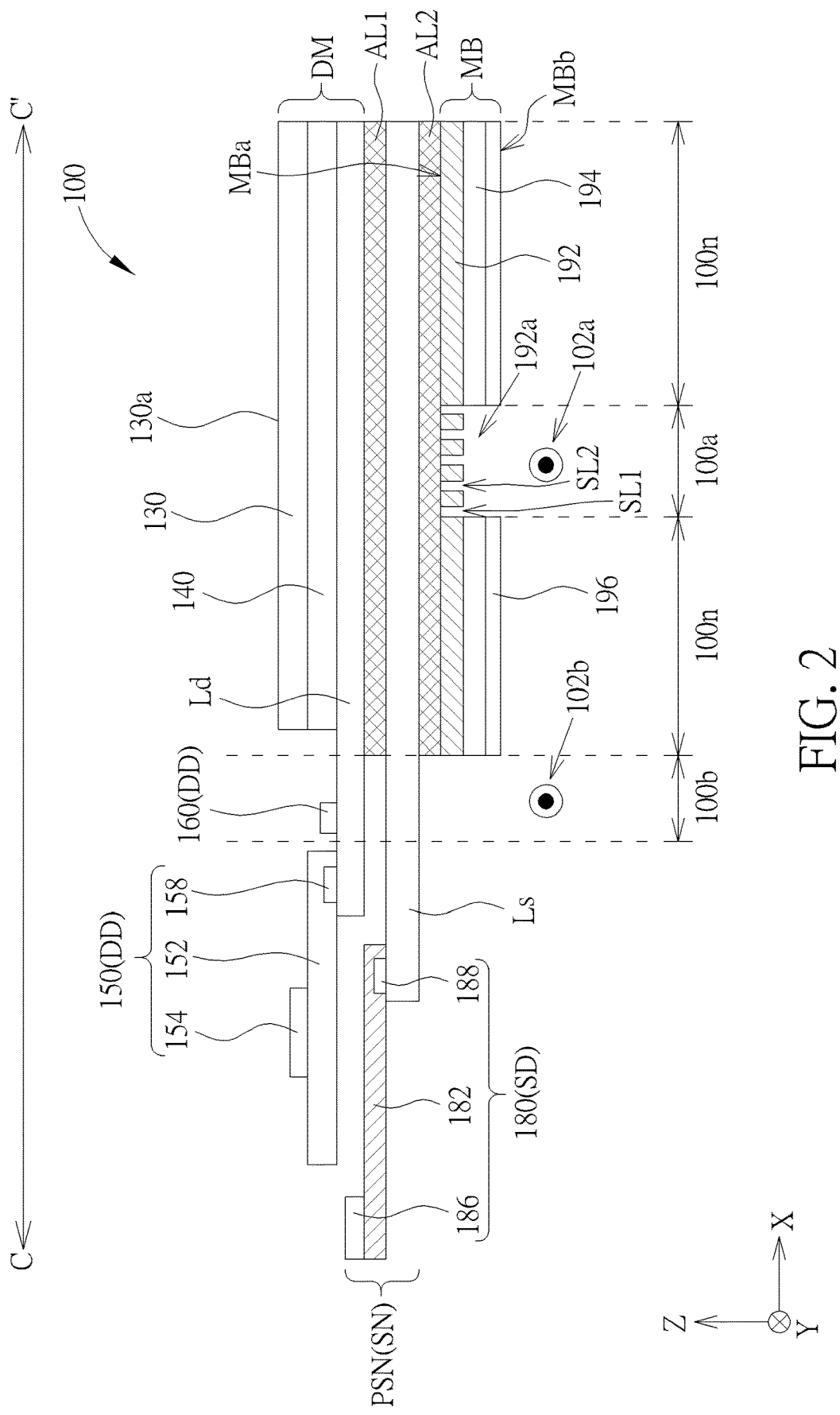
FIG. 2 and FIG. 3 are schematic diagrams showing a cross-sectional view of the flexible display apparatus according to the first embodiment of the present disclosure.
Figure 3:
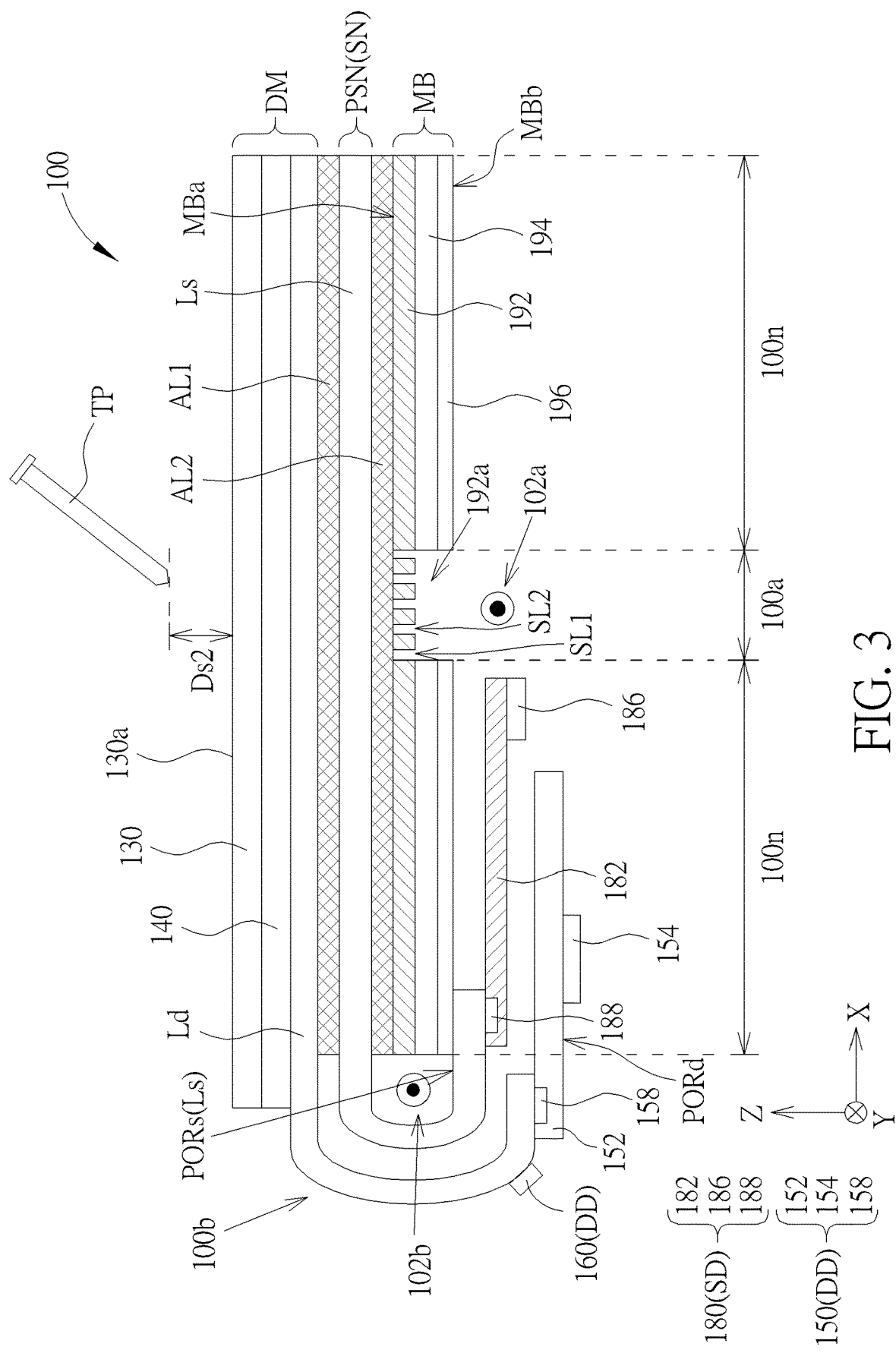

Referring to FIG. 1 to FIG. 3, FIG. 1 is a schematic diagram showing a top view of a flexible display apparatus according to a first embodiment of the present disclosure, and FIG. 2 and FIG. 3 are schematic diagrams showing a cross-sectional view of the flexible display apparatus according to the first embodiment of the present disclosure, wherein FIG. 2 shows the flexible display apparatus without bending, FIG. 2 shows a structure taken along a cross-sectional line C-C' in FIG. 1, and FIG. 3 shows the flexible display apparatus where a portion is bent.

As shown in FIG. 1 to FIG. 3, the present disclosure provides a flexible display apparatus including a display module DM, a metal plate MB and a sensor SN. The display module DM may have a flexible area, such as a first flexible area 100b and a second flexible area 100a. The metal plate MB is disposed under the display module DM. The metal plate MB has a first side MBa and a second side MBb opposite to each other. For instance, after the flexible display apparatus is bent along a first bending axis 102b situated in the first flexible area 100b, in FIG. 3, the first side MBa is a side of a top surface of the metal plate MB (the first side MBa is a side close to the display module DM), and the second side MBb is a side of a bottom surface of the metal plate MB, but not limited thereto. The metal plate MB includes the patterned portion 192a overlapped with the flexible area (e.g., the second flexible area 100a). The sensor SN has a sensing layer Ls and a driving component (e.g., the sensing driving component SD), and the driving component is electrically connected to the sensing layer Ls.

Figure 5:
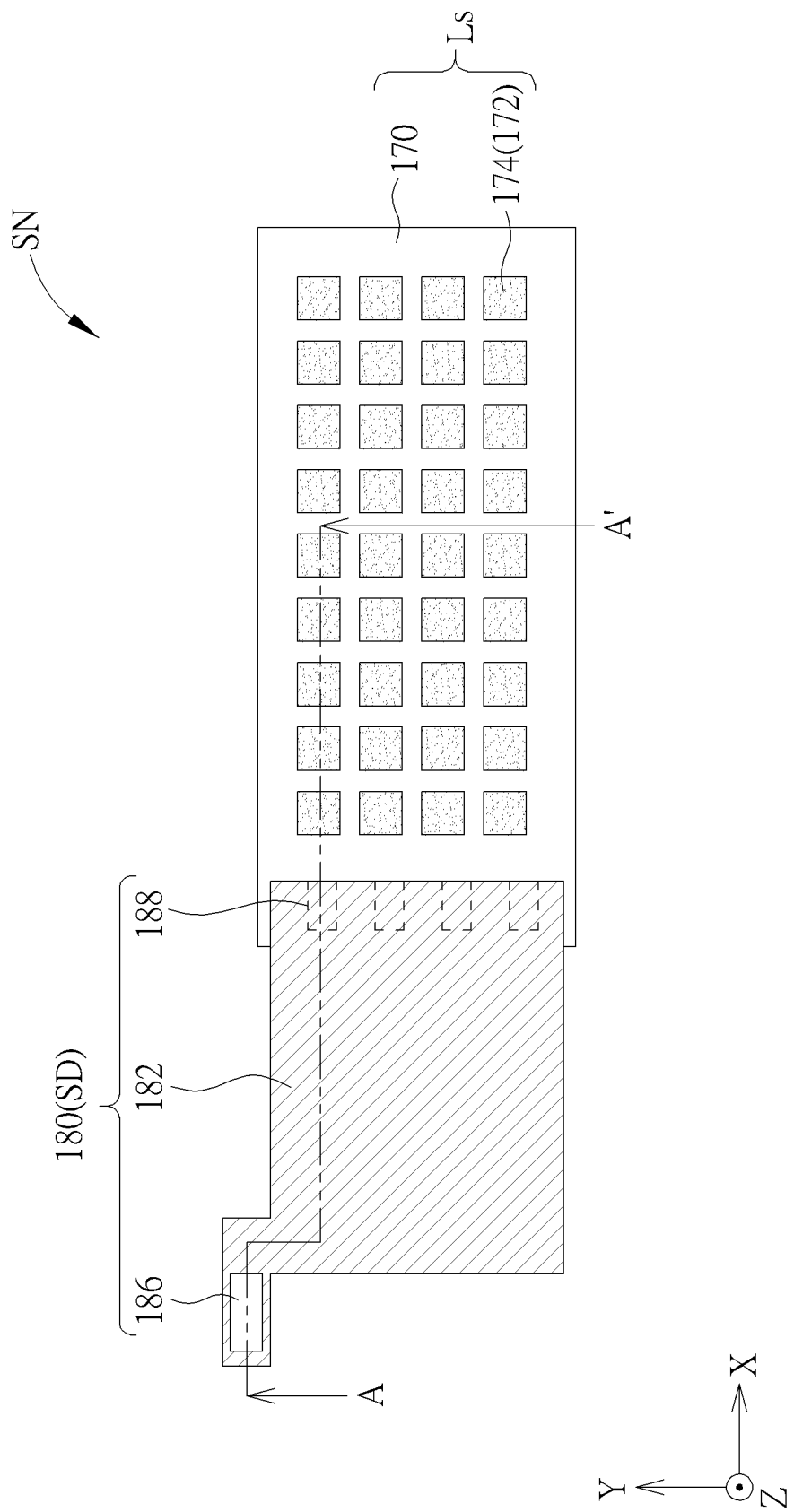
FIG. 5 is a schematic diagram showing a top view of the sensor of the flexible display apparatus according to the first embodiment of the present disclosure.

As shown in FIG. 3 and FIG. 5, the sensing layer Ls includes a second flexible substrate 170 and a plurality of sensing components 172. The sensing components 172 may be disposed on the second flexible substrate 170. The sensing layer Ls is disposed at the first side MBa of the metal plate MB close to the display module DM, the driving component (e.g., the sensing driving component SD) is electrically connected to the sensing layer Ls and disposed at the second side MBb of the metal plate MB opposite to the first side MBa. According to the above, the sensing layer Ls of the sensor SN is disposed at the first side MBa of the metal plate MB close to the display module DM, so as to prevent the sensing signal from being shielded by the metal plate MB. In some embodiments, the sensor SN may be a pen sensor PSN, thereby preventing signal(s) of a touch pen TP from being shielded by the metal plate MB. The sensing driving component SD of the sensor SN is disposed at the second side MBb of the metal plate MB, such that the sensing driving component SD may not occupy an area of a display face of the flexible display apparatus 100, thereby achieving a narrow-border effect.

As shown in FIG. 1 to FIG. 3, the flexible display apparatus 100 may include the flexible area(s), and the number of the flexible area(s) may be designed based on requirement(s). In FIG. 1 to FIG. 3, the display module DM may include a first flexible area 100b and a second flexible area 100a. As shown in FIG. 1 to FIG. 3, the first flexible area 100b may be bent along the first bending axis 102b, and the second flexible area 100a may be bent along the second bending axis 102a. According to some embodiments, the first bending axis 102b of the first flexible area 100b may be parallel to the second bending axis 102a of the second flexible area 100a. In some embodiments (as shown in FIG. 3), the second flexible area 100a may be a foldable area, such that the flexible display apparatus 100 may be a foldable display device, but not limited thereto. Moreover, the flexible display apparatus 100 may optionally include a non-flexible area 100n, and the non-flexible area 100n of the flexible display apparatus 100 cannot be bent. For instance, in FIG. 2 and FIG. 3, the second flexible area 100a may be situated between two non-flexible areas 100n, but not limited thereto.

In FIG. 1 to FIG. 3, the metal plate MB includes a patterned portion 192a in the second flexible area 100a (i.e., the patterned portion 192a is overlapped with the second flexible area 100a), wherein the patterned portion 192a may make the second flexible area 100a of the flexible display apparatus 100 be bent easily. In the present disclosure, the patterned portion 192a may have any suitable pattern and be formed by any suitable manufacturing process. For example, in FIG. 1 to FIG. 3, the patterned portion 192a may include a plurality of slits SL, but not limited thereto. The second bending axis 102a may extend along a first direction (a direction Y). In some embodiments (as shown in FIG. 1), the slit SL may extend the first direction (the direction Y), and the extending direction of the slit SL may be the same as the extending direction of the second bending axis 102a, but not limited thereto. The patterned portion 192a may include a plurality of columns of the slits SL, and the direction of the column is the first direction. The slits SL in two adjacent columns may be misaligned. Specifically, the slits SL1 and SL2 are in two adjacent columns, and the slits SL1 and SL2 may be misaligned in a second direction (a direction X) perpendicular to the first direction, but not limited thereto. For instance, the patterned portion 192a of the metal plate MB may be formed by a mechanical process, but not limited thereto. The metal plate MB is disposed under the display module DM in a third direction (a direction Z). The first direction (the direction Y), the second direction (the direction X), and the third direction (the direction Z) may be different. For instance the first direction (the direction Y), the second direction (the direction X), and the third direction (the direction Z) may be perpendicular to each other, but not limited thereto.

The metal plate MB may be a single-layer metal plate or a multi-layer plate having at least one metal layer, wherein the metal plate MB may include any suitable metal material, such as copper, iron, steel, nickel, other suitable metal material(s) or a combination thereof. The metal plate MB may optionally include non-metallic material, such as carbon. For example, in some embodiments, the metal plate MB may be a multi-layer plate including a stainless steel layer 192, a copper layer 194 and a graphite layer 196. For example, the metal plate MB may include the graphite layer 196 and the stainless steel layer 192 disposed on the graphite layer 196. That is to say, compared with the graphite layer 196, the stainless steel layer 192 is closer to the display module DM, but not limited thereto.

Figure 4:
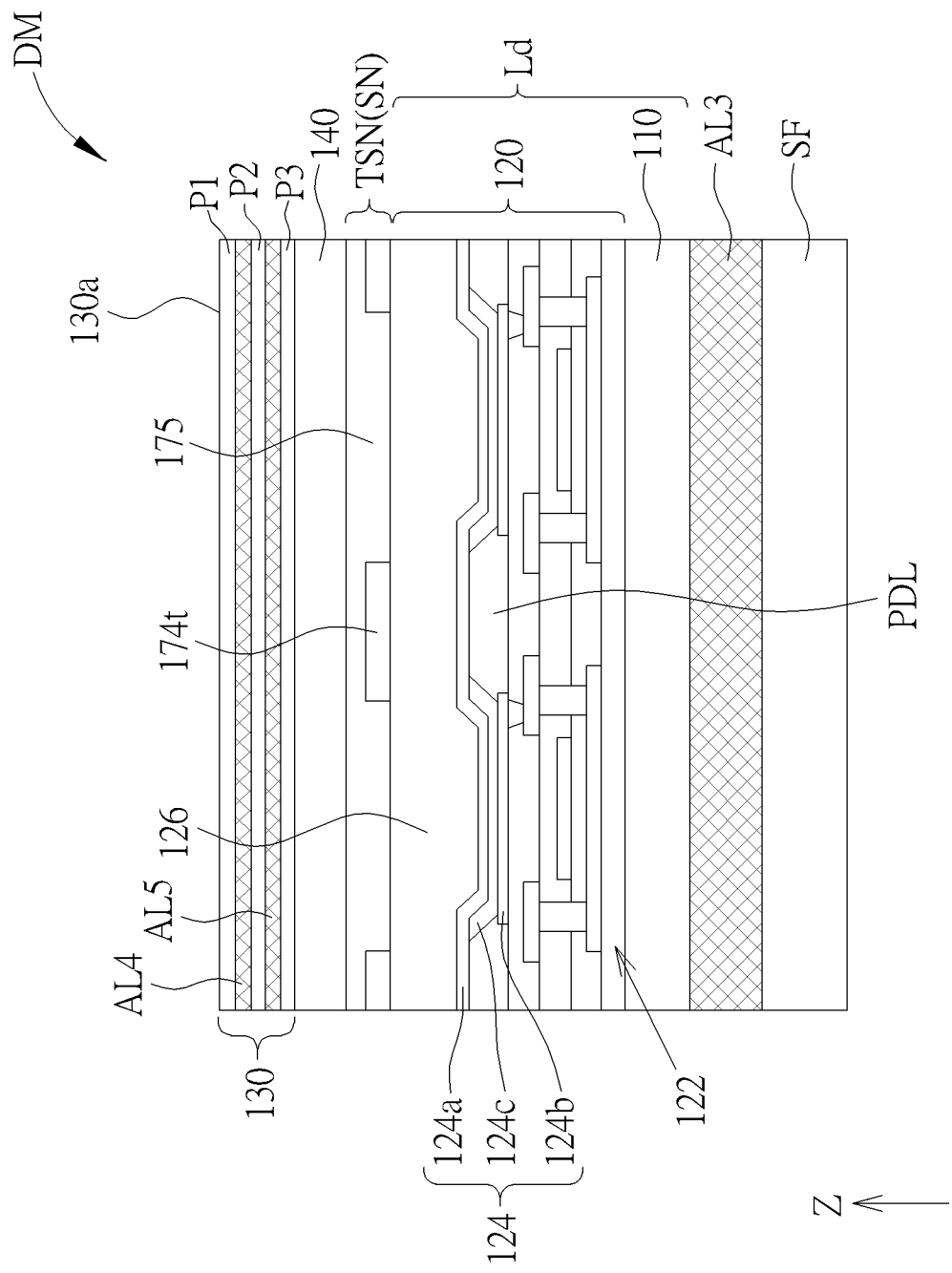
FIG. 4 is a schematic diagram showing a cross-sectional view of the display module of the flexible display apparatus according to the first embodiment of the present disclosure.

Referring to FIG. 4, and simultaneously referring FIG. 1 to FIG. 3, FIG. 4 is a schematic diagram showing a cross-sectional view of the display module of the flexible display apparatus according to the first embodiment of the present disclosure. As shown in FIG. 1 to FIG. 4, the flexible display apparatus 100 may include the display module DM, and the metal plate MB is disposed under the display module DM (under the condition that the flexible display apparatus 100 is not bent, the whole display module DM is disposed at the first side MBa of the metal plate MB, such that the first side MBa of the metal plate MB is a side close to the display module DM), wherein the display module DM may perform a display function in a display region, so as to display a corresponding image according to electric signal(s). In detail, in FIG. 4, the display module DM may include a display layer Ld and a cover layer 130. The display layer Ld may include a first flexible substrate 110 and a circuit component layer 120. The circuit component layer 120 and the cover layer 130 are disposed on the first flexible substrate 110, and the circuit component layer 120 is between the cover layer 130 and the first flexible substrate 110.

In the present disclosure, the first flexible substrate 110 may include any suitable flexible material, such as polyimide (PI), polyethylene terephthalate (PET), ultra-thin glass (UTG), silicon oxide ($SiO_x$), other suitable material(s) or a combination thereof, but not limited thereto.

The circuit component layer 120 may include at least one conductive layer, at least one insulating layer, at least one semiconductor layer, other suitable layer(s) or a combination thereof, so as to form a multi-layer structure. The material of the conductive layer may include metal, transparent conductive material (such as indium tin oxide (ITO), indium zinc oxide (IZO), etc.), other suitable conductive material(s) or a combination thereof, the material of the insulating layer may include such as silicon oxide ($SiO_x$), silicon nitride ($SiN_y$), silicon oxynitride ($SiO_xN_y$), organic material (e.g., photosensitive resin), other suitable insulating material(s) or a combination thereof, the material of the semiconductor layer may include such as poly-silicon, amorphous silicon, metal-oxide semiconductor (e.g., IGZO), other suitable semiconductor material(s) or a combination thereof, but not limited thereto.

The circuit component layer 120 may include the corresponding component(s) and/or the corresponding structure(s) based on the function had in the display module DM. For example, the circuit component layer 120 may include a switch component 122 (e.g., a thin film transistor), a light emitting element 124, a capacitor, a conductive trace (e.g., a scan line and/or a data line), a display driving circuit (e.g., a gate driving circuit), other suitable component(s) or a combination thereof, thereby displaying an image.

In some embodiments, the light emitting element 124 may be a light-emitting diode (e.g., an organic light-emitting diode, an inorganic light-emitting diode or a quantum-dot light-emitting diode) and be disposed in the display region. The light emitting element 124 may be a micro-LED or a mini-LED. For instance, in FIG. 4, the light emitting element 124 may include an electrode 124a, an electrode 124b and a light emitting layer 124c disposed between the electrode 124a and the electrode 124b, but not limited thereto. Each light emitting element 124 may be individually included in one of the sub-pixels to be a portion of this sub-pixel, and may be electrically connected to at least one component in the circuit component layer 120 (e.g., the switch component 122 in the sub pixel). For instance, in some embodiments, each sub-pixel may include one light emitting element 124 or a plurality of light emitting elements 124. In some embodiments, the light emitting element 124 may provide the light with the corresponding light intensity according to the received voltage and/or current.

In some embodiments, the color of the light emitted from the light emitting element 124 may be designed based on requirement(s). For example, the color or the light emitted from the light emitting element 124 may be based on the sub-pixel where this light emitting element 124 is disposed, wherein the emitting light may be red light, green light or blue light, but not limited thereto. In some embodiments, all of the light emitting elements 124 may emit the same color light, and the display module DM may further include a light converting layer (not shown in figures) disposed on the light emitting element 124, so as to convert (or filter) the light emitted from the light emitting element 124 into another light with different color. The light converting layer may include color filter, quantum dots (QD) material, fluorescence material, phosphorescence material, other suitable material(s) or a combination thereof. For instance, the light emitting element 124 may emit white light, the light converting layer may convert the white light into another color light which the sub-pixel needs, such as red light, green light or blue light, but not limited thereto. For instance, the light emitting element 124 may emit blue light, the light converting layer may convert the blue light into another color light which the sub-pixel needs, such as red light or green light, or may not convert to maintain the blue light, but not limited thereto.

In addition, in FIG. 4, the circuit component layer 120 of the display module DM may optionally include a pixel defining layer PDL disposed between two light emitting elements 124 and/or two sub-pixels, so as to separate the light emitting elements 124 from each other and/or separate the sub-pixel from each other. The pixel defining layer PDL may be a single-layer structure or a composite structure, and may include insulating material, reflective material, other suitable material(s) or a combination thereof, but not limited thereto. Furthermore, the display module DM may optionally include an encapsulating layer 126 disposed on the light emitting element 124, so as to protect the light emitting element 124. The material of the encapsulating layer 126 may be any suitable insulating material, such as silicon oxide ($SiO_x$), silicon nitride ($SiN_y$), silicon oxynitride ($SiO_xN_y$), other suitable insulating material(s) or a combination thereof.

The cover layer 130 configured to protect the structures (e.g., the circuit component layer 120) which are covered by the cover layer 130, and at least a portion of the cover layer 130 may be flexible. In some embodiments, the cover layer 130 may be a single-layer flexible structure or a multi-layer flexible structure, and the cover layer 130 may include any suitable flexible material, such as PI, PET, UTG, silicon oxide, other suitable material(s) or a combination thereof, but not limited thereto. For instance, the cover layer 130 shown in FIG. 4 may be a multi-layer flexible structure (a layer P1, a layer P2 and a layer P3), the layer P1 and the layer P3 may include PET, the layer P2 disposed between the layer P1 and the layer P3 may include UTG, but not limited thereto. For instance, the thickness of the layer P1 and the thickness of the layer P3 may range from 20 μm to 60 μm, and the thickness of the layer P2 may range from 10 μm to 40 μm, but not limited thereto. In FIG. 4, for example, the layer P1 may adhere to the layer P2 through an adhering layer AL4, and the layer P2 may adhere to the layer P3 through an adhering layer AL5, but not limited thereto.

In some embodiments, an outer surface 130a of the cover layer 130 may be a light outputting surface of the flexible display apparatus 100, wherein the light outputting surface of the flexible display apparatus 100 is an outermost surface which the light provided from the flexible display apparatus 100 passes through, but not limited thereto.

The display module DM may further include an optical layer 140, such as a polarizer and/or an anti-reflection film, disposed at any suitable position, but not limited thereto. For example, in FIG. 4, the optical layer 140 may be disposed between the cover layer 130 and the circuit component layer 120, but not limited thereto.

As shown in FIG. 4, the display module DM may optionally include a supporting layer SF configured to support the first flexible substrate 110. For instance, in FIG. 4, the supporting layer SF may be adhered to the first flexible substrate 110 through the adhering layer AL3, such that the first flexible substrate 110 is between the supporting layer SF and the circuit component layer 120, but not limited thereto. The supporting layer SF may include any suitable material, such as PI, PET or other suitable flexible material(s), but not limited thereto. In some embodiments, the display module DM may not include the supporting layer SF, and the sensor SN under the display module DM may be adhered to the display module DM through the adhering layer AL1 (as shown in FIG. 3 and FIG. 4). In detail, the sensor SN may be adhered to the first flexible substrate 110 of the display module DM. Although there is no supporting layer SF, the second flexible substrate 170 of the sensing layer Ls may provide the supporting function.

As shown in FIG. 3, the display module DM may further include a display driving component DD disposed on the first flexible substrate 110. For example, at least a portion of the display driving component DD (e.g., the gate driving circuit) may be disposed in the circuit component layer 120.

As shown in FIG. 1 to FIG. 3, the display driving component DD of the display module DM may include a first circuit board 150 disposed on the first flexible substrate 110 of the display module DM. The first circuit board 150 may include a board body 152 and any suitable electronic component disposed on the board body 152. The board body 152 may be a rigid board body or a flexible board body, such that the first circuit board 150 may be a rigid printed circuit or a flexible printed circuit (FPCB) based on requirement(s).

For example, the first circuit board 150 may include any suitable electronic component (e.g., a bonding pad 158, a trace, a chip 154, a connecting element 156, etc.) disposed on the flexible board body 152, such that the first circuit board 150 may be a flexible printed circuit assembly (FPCA), but not limited thereto. In some embodiments, the first circuit board 150 may be connected to the first flexible substrate 110 through a solder, and the first circuit board 150 may be electrically connected to the electronic component of the display module DM through the bonding pad 158, the solder and the bonding pad of the first flexible substrate 110. For instance, the chip 154 of the first circuit board 150 may drive the component (e.g., the light emitting element 124, the driving circuit, etc.) of the display module DM, but not limited thereto. The connecting element 156 of the first circuit board 150 may be configured to be connected to an outer device (e.g., a voltage source), but not limited thereto.

In some embodiments, the display driving component DD of the display module DM may optionally include a driving chip 160 disposed on (or bonded to) the first flexible substrate 110, wherein the driving chip 160 is configured to drive the component (e.g., the light emitting element 124, the driving circuit, etc.) in the display module DM, but not limited thereto.

Moreover, the display module DM may optionally include other suitable component(s) and/or structure(s). In some embodiments, the display module DM may further include a light shielding layer configured to divide the sub-pixels and shield some components, so as to reduce the probability that the external light is reflected by the flexible display apparatus 100, thereby increasing the display quality, but not limited thereto. The light shielding layer may include photoresist, ink, resin, pigment, other suitable light shielding material(s) or a combination thereof, but not limited thereto.

Figure 6:
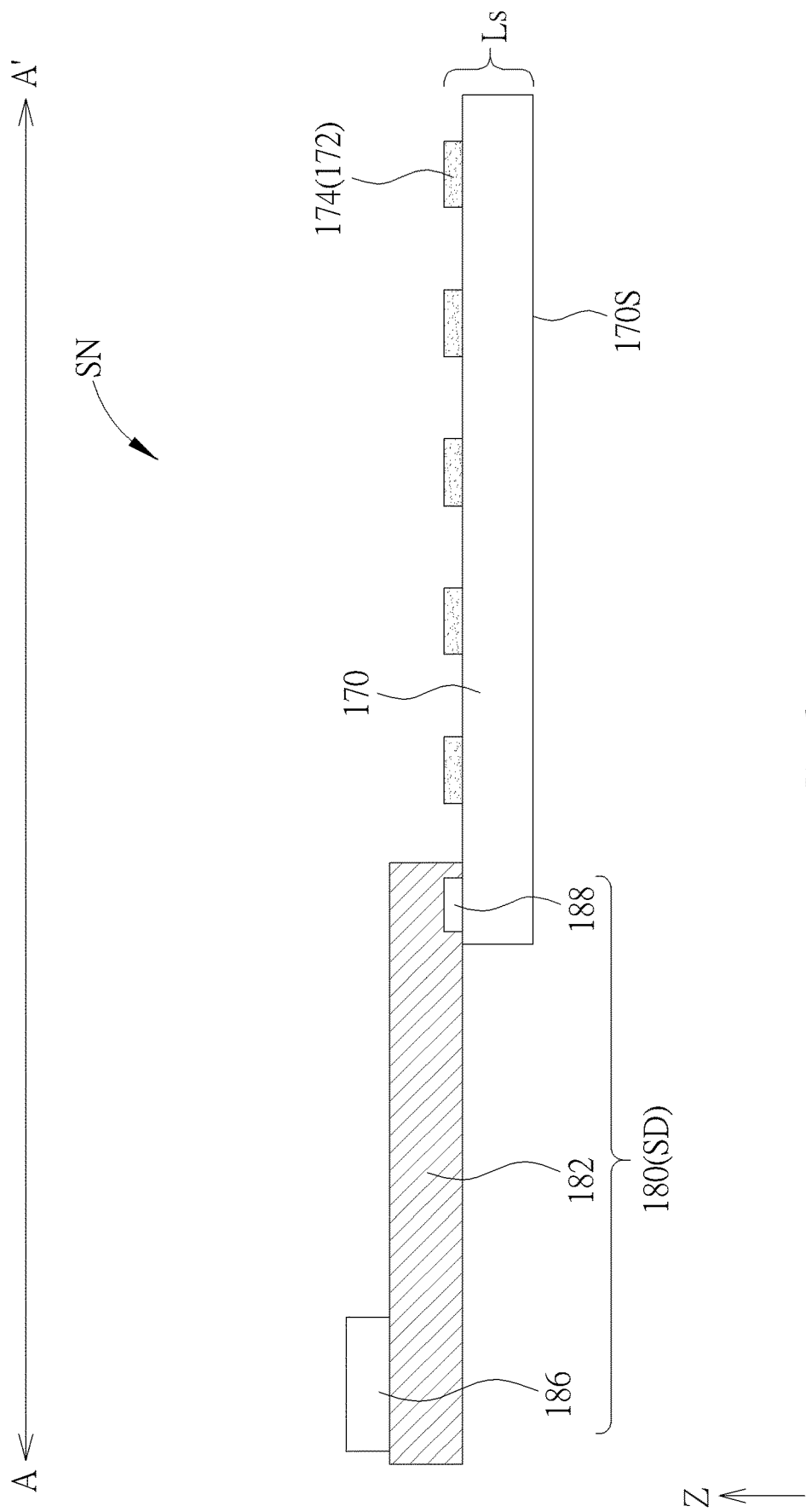
FIG. 6 is a schematic diagram showing a cross-sectional view of a structure taken along a cross-sectional line A-A' in FIG. 5.

Referring to FIG. 5 and FIG. 6, and simultaneously referring FIG. 1 to FIG. 3, FIG. 5 is a schematic diagram showing a top view of the sensor SN of the flexible display apparatus according to the first embodiment of the present disclosure, and FIG. 6 is a schematic diagram showing a cross-sectional view of a structure taken along a cross-sectional line A-A' in FIG. 5. As shown in FIG. 1 to FIG. 3, FIG. 5 and FIG. 6, the flexible display apparatus 100 may include the sensor SN configured to perform a sensing function. For example, the sensor SN may include a touch sensor, a pen sensor, a fingerprint sensor, other suitable sensor(s) or a combination thereof, but not limited thereto. In FIG. 2 and FIG. 3, the metal plate MB may be disposed under the sensor SN (under the condition that the flexible display apparatus 100 is not bent, the whole sensor SN is disposed at the first side MBa of the metal plate MB). For example, in FIG. 2 and FIG. 3, the sensor SN (e.g., a pen sensor PSN) may be disposed between the metal plate MB and the display module DM, but not limited thereto.

In FIG. 5 and FIG. 6, the sensor SN may include a sensing layer Ls and a sensing driving component SD which are electrically connected to each other. In detail, the sensing layer Ls may include a second flexible substrate 170 and a sensing component 172, wherein the sensing component 172 may have a pattern and disposed on the second flexible substrate 170. The sensing driving component SD may include a second circuit board 180. The second circuit board 180 may include a flexible board body 182, a connecting element 186 and a bonding pad 188, wherein the connecting element 186 and the bonding pad 188 may be disposed on the flexible board body 182. The connecting element 186 may be configured to be connected to an outer device (e.g., a voltage source), but not limited thereto. The sensing component 172 of the sensing layer Ls may be electrically connected to the electronic component of the sensing driving component SD through the bonding pad 188 of the sensing driving component SD. In the present disclosure, the second flexible substrate 170 may include any suitable flexible material, such as PI, PET, UTG, silicon oxide, other suitable material(s) or a combination thereof, but not limited thereto. The material of the second flexible substrate 170 of the sensor SN may be the same as or different from the material of the first flexible substrate 110 of the display module DM. For instance, the second flexible substrate 170 may include two polyimide layers and a silicon oxide layer between two polyimide layers, so as to enhance the effect of the second flexible substrate 170 to block the moisture or the oxygen, but not limited thereto.

The sensing component 172 may be disposed on the second flexible substrate 170 and disposed in a sensing region of the sensor SN, and the sensing component 172 may include any suitable conductive material. The sensing component 172 may be designed according to the type of the sensor SN, and the corresponding sensing function may be performed based on the design of the sensing component 172. For instance, the sensing component 172 may include at least one sensing unit 174, at least one conductive trace or other suitable component(s), but not limited thereto.

In some embodiments, the sensor SN may be a pen sensor PSN. For example, the pen sensor PSN may be an electro-magnetic resonance (EMR) pen sensor, an active electro-static solution (AES) pen sensor or other suitable pen sensor. An exemplary explanation of the pen sensor PSN is described in the following under the condition that the pen sensor PSN is the EMR pen sensor, and FIG. 7 to FIG. 9 which show the structure of the EMR pen sensor are simultaneously referred (FIG. 8 is an enlarging schematic diagram showing a structure in a region RR in FIG. 7, and FIG. 9 is a schematic diagram showing a cross-sectional view of a structure taken along a cross-sectional line B-B' in FIG. 8).

Figure 7:
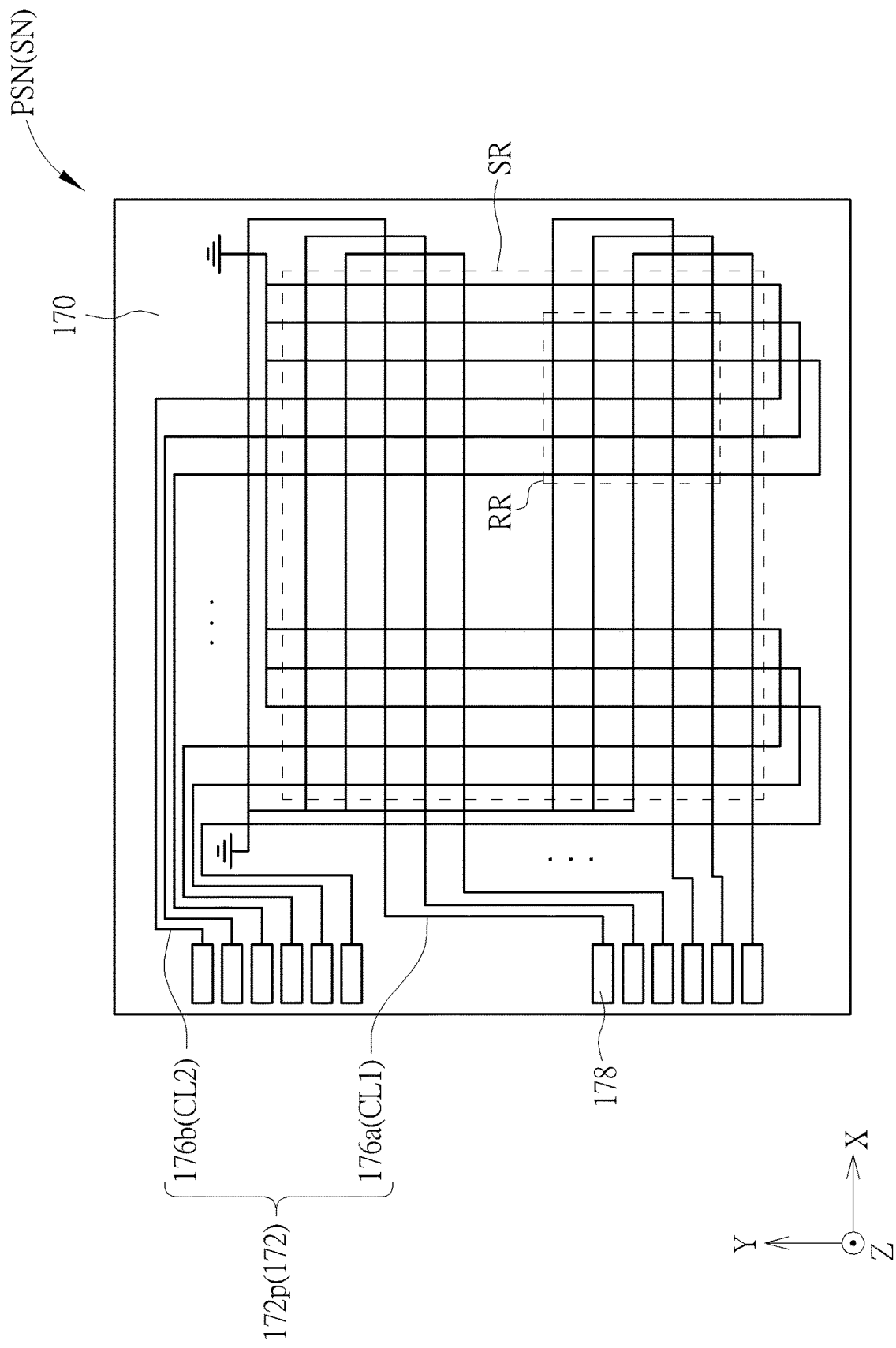
FIG. 7 is a schematic diagram showing a top view of the pen sensor according to an embodiment of the present disclosure.
Figure 8:
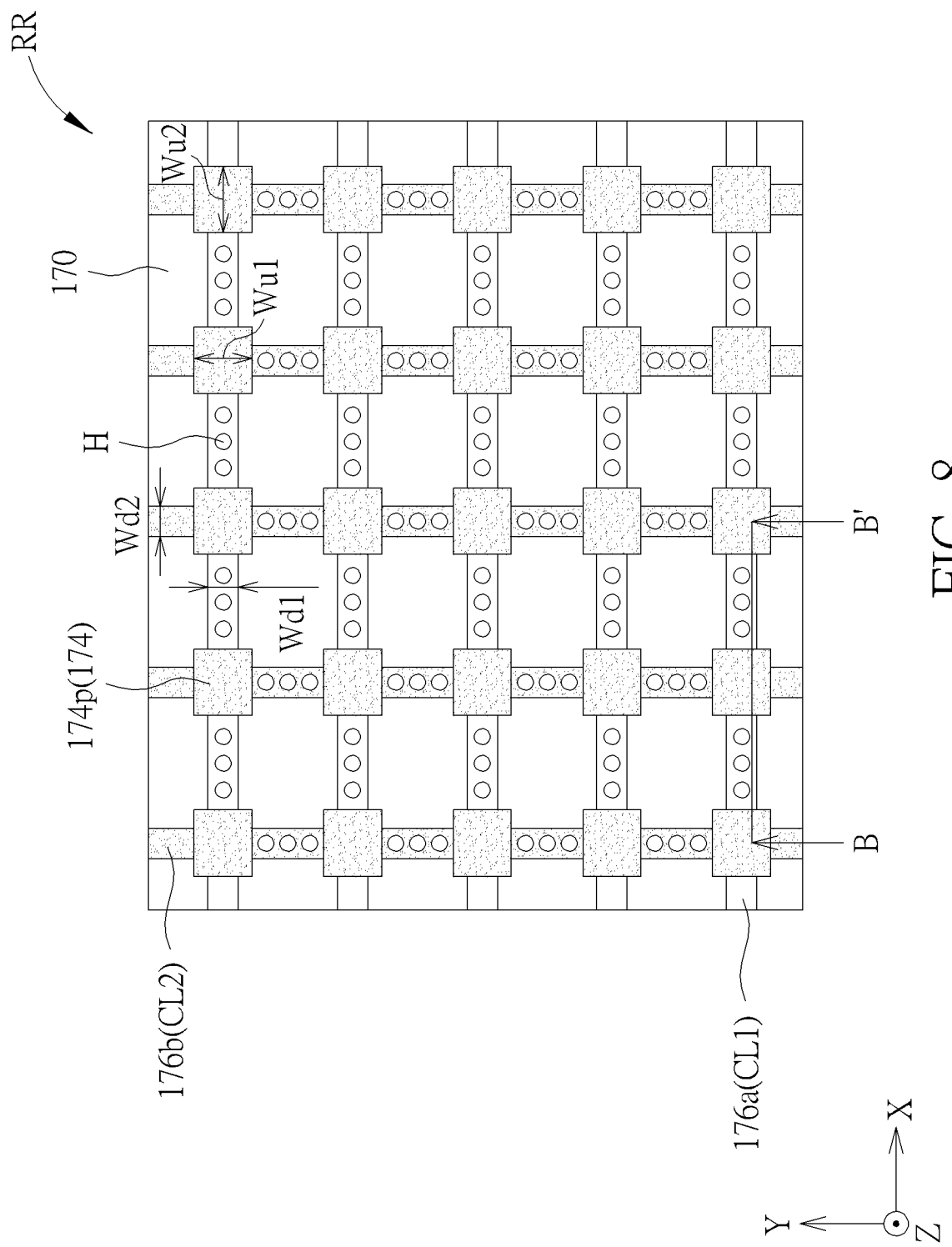
FIG. 8 is an enlarging schematic diagram showing a structure in a region RR in FIG. 7.
Figure 9:
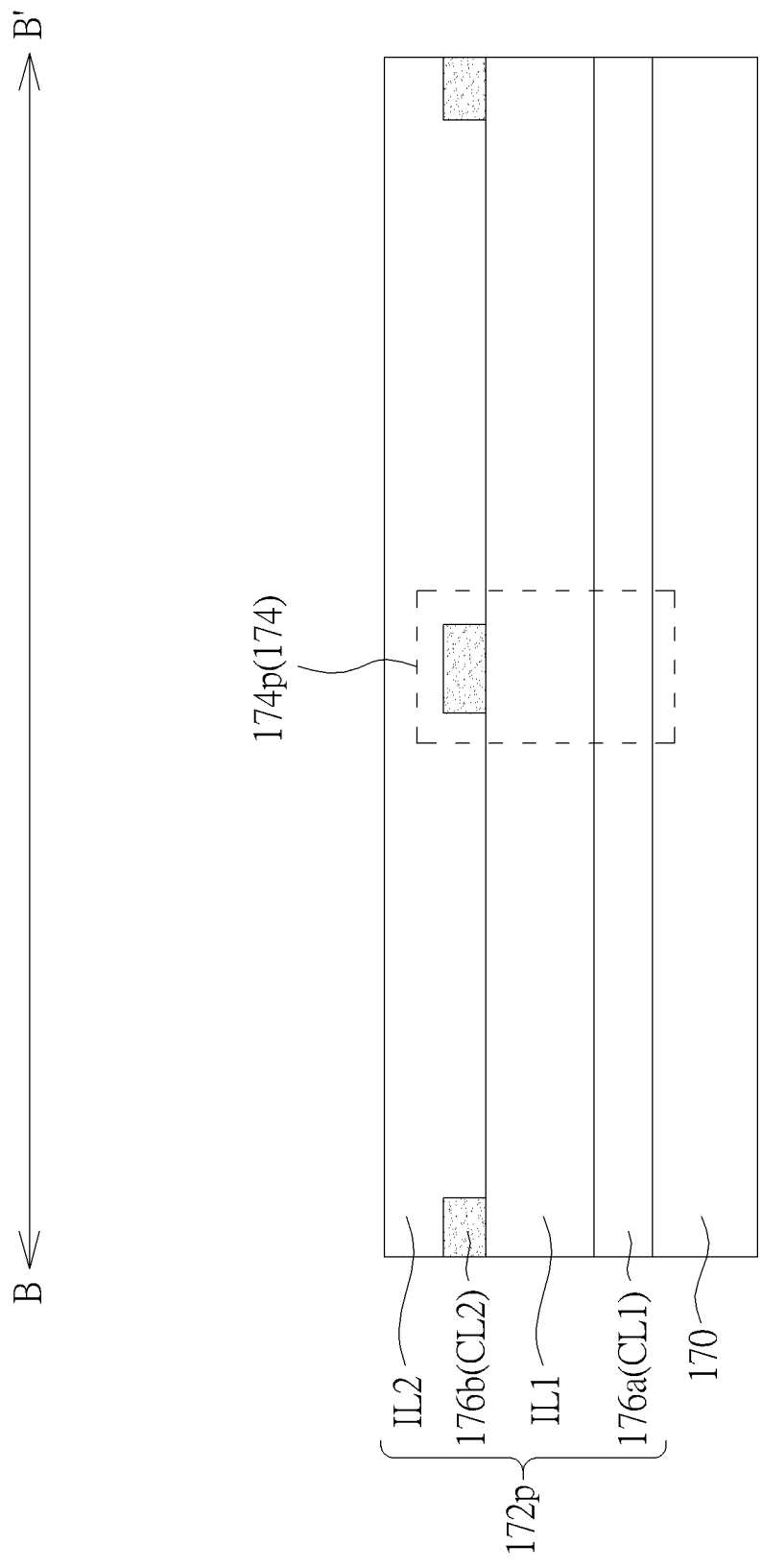
FIG. 9 is a schematic diagram showing a cross-sectional view of a structure taken along a cross-sectional line B-B' in FIG. 8

As shown in FIG. 7 to FIG. 9, a touch pen sensing component 172p of the pen sensor PSN may include a first conductive layer CL1, a first insulating layer IL1, a second conductive layer CL2 and a second insulating layer IL2, wherein the first insulating layer IL1 is disposed between the first conductive layer CL1 and the second conductive layer CL2, and the second conductive layer CL2 is disposed between the second insulating layer IL2 and the first insulating layer IL1. The material of the first conductive layer CL1 and the material of the second conductive layer CL2 may include such as metal, transparent conductive material (e.g., ITO, IZO, etc.), other suitable conductive material(s) or a combination thereof, and the material of the first insulating layer IL1 and the material of the second insulating layer IL2 may include such as silicon oxide, silicon nitride, silicon oxynitride, organic material (e.g., photosensitive resin), other suitable insulating material(s) or a combination thereof.

The touch pen sensing component 172p of the pen sensor PSN may include a plurality of first sensing lines 176a and a plurality of second sensing lines 176b, wherein the first sensing line 176a and the second sensing line 176b may have a U-shape pattern in the top view, and the first sensing line 176a and the second sensing line 176b belong to different conductive layers. For instance, the first conductive layer CL1 may include the first sensing lines 176a, and the second conductive layer CL2 may include the second sensing lines 176b. In FIG. 7, the first sensing lines 176a and the second sensing lines 176b form a plurality of closed patterns (e.g., multiple rectangular patterns arranged in a grid shown in FIG. 7) in the top view, but not limited thereto.

In FIG. 7 to FIG. 9, in the touch pen sensing component 172p, the overlap of the first sensing line 176a and the second sensing line 176b may form a touch pen sensing unit 174p (e.g., FIG. 8 shows 25 touch pen sensing units 174p). Under the condition that the pen sensor PSN is the EMR pen sensor, the touch pen sensing component 172p may include a plurality of digitizer sensors serving as the touch pen sensing units 174p, but not limited thereto.

Optionally, in some embodiments (as shown in FIG. 8), a horizontal size Wu1 (in the direction Y) of the touch pen sensing unit 174p may be greater than a width Wd1 of the first sensing line 176a, a horizontal size Wu2 (in the direction X) of the touch pen sensing unit 174p may be greater than a width Wd2 of the second sensing line 176b, so as to increase the sensing area of the touch pen sensing component 172p, but not limited thereto. In some embodiments, both of the horizontal size Wu1 (in the direction Y) and the horizontal size Wu2 (in the direction X) of the touch pen sensing unit 174p may be greater than the width Wd1 of the first sensing line 176a and the width Wd2 of the second sensing line 176b. Optionally, in some embodiments (as shown in FIG. 8), the first sensing line 176a and the second sensing line 176b may have a plurality of holes H, so as to decrease the possibility of the damage on the first sensing line 176a and/or the second sensing line 176b caused by the bend of the flexible display apparatus 100, but not limited thereto.

In FIG. 7 to FIG. 9, the pen sensor PSN may generate an electromagnetic field through the configuration of the first sensing lines 176a and the second sensing lines 176b, and the touch pen TP (as shown in FIG. 3) may affect the electromagnetic field, such that the touch pen sensing unit 174p (e.g., the digitizer sensor) in the touch pen sensing component 172p may detect the information (e.g. the touch position, the moving direction and/or the touch pressure) of the touch pen, thereby performing the touch pen sensing function. For instance, the touch pen TP may include a capacitor for affecting the electromagnetic field, but not limited thereto.

In the present disclosure, the operation of the touch pen TP may be designed based on requirement(s). In some embodiments (as shown in FIG. 3), the pen sensor PSN may perform the touch pen sensing function under the condition that the touch pen TP is not in contact with the flexible display apparatus 100 (i.e., a distance Ds2 exists between the touch pen TP and the flexible display apparatus 100) and/or under the condition that the touch pen TP is in contact with the flexible display apparatus 100 (i.e., the distance Ds2 is 0). For example, the distance Ds2 may be greater than or equal to 0 mm and less than or equal to 50 mm, but not limited thereto. When the touch pen TP is not in contact with the flexible display apparatus 100, the sensing power of the pen sensor PSN needs to be increased (e.g., the driving voltage is increased). When the touch pen TP is in contact with the flexible display apparatus 100, a hardness of the touch pen TP may be less than a hardness of an outmost structure of the flexible display apparatus 100 (e.g., the hardness of the cover layer 130) or less than a hardness of the whole structure of the flexible display apparatus 100. For instance, the hardness of the whole structure of the flexible display apparatus 100 may be measured from the outmost structure. For example, the hardness of the nib of the touch pen TP may be 8B, and the hardness the outmost structure of the flexible display apparatus 100 or the whole structure of the flexible display apparatus 100 may range from 6B to 2H, but not limited thereto.

In some embodiments, the sensor SN may be a touch sensor to sense the touch position of the finger(s) and/or the movement of the finger(s), wherein the touch sensor may be such as a capacitive touch sensor (the touch position of the finger(s) and/or the movement of the finger(s) may be sensed by detecting the coupling between the touch sensing unit of the touch sensing component and the finger(s)), a resistive touch sensor (the touch position of the finger (s) and/or the movement of the finger(s) may be sensed by detecting the conduction of the touch sensing unit affected by the finger(s) pressing on the touch sensing unit) or other suitable touch sensor. For example, in some embodiments, the touch sensing unit of the touch sensing component in the touch sensor may be a touch sensing electrode, but not limited thereto.

In some embodiments, the sensor SN may be a fingerprint sensor configured to sense a biometric feature (e.g., a fingerprint), wherein the fingerprint sensor may be such as a capacitive fingerprint sensor, an optical fingerprint sensor, an ultrasonic fingerprint sensor or other suitable fingerprint sensor. In some embodiments using the capacitive fingerprint sensor, a fingerprint sensing unit of a fingerprint sensing component may include such as an electrode, a capacitor or other suitable capacitor sensing unit, such that when the fingerprint sensing unit senses, a capacitance of a corresponding region of the biometric feature (e.g., the fingerprint) is obtained, and the biometric feature identification may be processed according to the differences of the capacitances of all sensing regions (i.e., a capacitance corresponding to a fingerprint ridge region is different from a capacitance corresponding to a fingerprint valley region), but not limited thereto. In some embodiments using the optical fingerprint sensor, a fingerprint sensing unit of a fingerprint sensing component may include a PIN diode (having a P-type semiconductor layer, an intrinsic layer and an N-type semiconductor layer) or other suitable photoelectric conversion unit, and the biometric feature identification may be performed according to light intensity of reflective light reflected from the biometric feature and received by the fingerprint sensing unit during sensing period (e.g., the light intensities of the light reflected from the fingerprint ridge and the light reflected from the fingerprint valley are different), but not limited thereto. In some embodiments using the ultrasonic fingerprint sensor, a fingerprint sensing unit of a fingerprint sensing component may include such as an ultrasonic receiving generating unit, which includes two electrodes and a piezoelectric layer sandwiched between these two electrodes, but not limited thereto. In the sensing process, a suitable voltage difference may be applied on two electrodes of the ultrasonic receiving generating unit to deform the piezoelectric layer (e.g., rapid vibration) for generating an ultrasonic wave, and the ultrasonic wave may be reflected to be a reflective ultrasonic wave with corresponding intensity based on the profile of the biometric feature (e.g., the intensities of the reflective ultrasonic wave of the fingerprint ridge and the reflective ultrasonic wave of the fingerprint valley are different). Then, the piezoelectric layer of the ultrasonic receiving generating unit may correspondingly deform (e.g., rapid vibration) after receiving the reflective ultrasonic wave, thereby generating a voltage difference between the two electrodes. Finally, the biometric feature identification may be performed according to the differences of the generated voltage differences (the generated voltage difference corresponding to the fingerprint ridge region is different from the generated voltage difference corresponding to the fingerprint valley region), but not limited thereto.

As shown in FIG. 1 to FIG. 3, FIG. 5 and FIG. 6, the sensing driving component SD may include the second circuit board 180 disposed on the second flexible substrate 170 of the sensor SN. The board body 182 of the second circuit board 180 may be a rigid board body or a flexible board body, such that the second circuit board 180 may be a rigid printed circuit or a flexible printed circuit (FPCB) based on requirement(s). For instance, the second circuit board 180 may include any suitable electronic component (e.g., a bonding pad 188, a trace, a chip, a connecting element 186, etc.) disposed on the flexible board body 182, such that the second circuit board 180 may be a flexible printed circuit assembly (FPCA), but not limited thereto. In some embodiments, the second circuit board 180 may be connected to the second flexible substrate 170 through a solder, and the second circuit board 180 may be electrically connected to the electronic component of the sensor SN through the bonding pad 188, the solder and the bonding pad 178 of the second flexible substrate 170. For example, the chip of the second circuit board 180 may drive the sensing component 172 (e.g., the sensing unit 174) of the sensor SN, but not limited thereto. The connecting element 186 of the second circuit board 180 may be configured to be connected to an outer device (e.g., a voltage source), but not limited thereto.

The sensing unit 174 of the sensing component 172 in the sensor SN may be connected to the bonding pad 178 disposed on the second flexible substrate 170 and outside the sensing region SR through the trace, so as to be electrically connected to the electronic component of the second circuit board 180 (e.g., the chip). For instance, in FIG. 7, the first sensing line 176a and the second sensing line 176b may be electrically connected to the bonding pad 178 on the second flexible substrate 170, and therefore, the touch pen sensing unit 174p of the touch pen sensing component 172p may be electrically connected to the second circuit board 180 through the first sensing line 176a and/or the second sensing line 176b. According to some embodiments, for instance, a conductive line fan-out region may exist between the bonding pad 178 on the second flexible substrate 170 and the sensing region SR, such that the first sensing line 176a and the second sensing line 176b may be fanned out in the conductive line fan-out region.

Furthermore, the sensor SN may optionally include any suitable component (s) based on requirement(s). For example, the sensor SN may further include an inductive charging element (e.g., an inductive coil) configured to wirelessly charge the touch pen, but not limited thereto. For instance, in addition to the second circuit board 180, the sensing driving component SD of the sensor SN may further include other component(s) disposed on the second flexible substrate 170 based on requirement(s).

In some embodiments (as shown in FIG. 1), a space W may exist between an edge of the sensor SN and an edge of the metal plate MB, and this space W may be a place where an outer shell of the flexible display apparatus 100 is disposed. For instance, the space W may range from 20 μm to 200 μm, so as to make the flexible display apparatus 100 have the narrow border, but not limited thereto.

In the present disclosure, the flexible display apparatus 100 may include one sensor SN or a plurality of sensors SN. For example, in addition to the pen sensor PSN, the flexible display apparatus 100 may optionally include a touch sensor TSN (i.e., a kind of the sensor SN), and the touch sensor TSN may be disposed at any suitable position. For instance, the touch sensor TSN in FIG. 4 may be disposed between the light emitting element 124 and the cover layer 130 of the display module DM, but not limited thereto. In FIG. 4, a touch sensing component of the touch sensor TSN may include a touch sensing unit 174t having a touch electrode and an insulating layer 175 (e.g., an optical clear adhesive (OCA)) configured to protect the touch sensing unit 174t, but not limited thereto. According to some embodiments, the touch sensor TSN may be disposed in the display module DM, and thus, the chip 154 of the first circuit board 150 may drive the touch sensing unit 174t of the touch sensor TSN and the light emitting element 124 of the display module DM (i.e., the chip 154 may be a touch and display driver integration (TDDI)), but not limited thereto.

Moreover, in the top view, a sensing area of the sensor SN and a resolution of the sensor SN may be designed based on requirement(s). If the flexible display apparatus 100 includes a plurality of sensors SN, the relations between the sensing areas of the sensors SN may be designed based on requirement(s).

As shown in FIG. 1 to FIG. 3, in the top view, the first circuit board 150 of the display module DM and the second circuit board 180 of the sensor SN may be disposed on the same side of the flexible display apparatus 100, but not limited thereto. In detail, as shown in FIG. 1, the flexible display apparatus 100 has a first side E1 and a second side E2 which are opposite to each other in the second direction (the direction X). The first circuit board 150 and the second circuit board 180 may be disposed on the second side E2. According to some embodiments, as shown in the top view of FIG. 1, under the condition that the flexible display 100 is bent or not bent, the first circuit board 150 of the display module DM partially overlaps the second circuit board 180 of the sensor SN. In FIG. 1, the connecting element 156 of the first circuit board 150 may not overlap the second circuit board 180, and the connecting element 186 of the second circuit board 180 may not overlap the first circuit board 150. In FIG. 1, the connecting element 156 of the first circuit board 150 and the connecting element 186 of the second circuit board 180 may be misaligned with each other. For example, the connecting element 156 may be misaligned with the connecting element 186 in the first direction (the direction Y).

In the present disclosure, the flexible display apparatus 100 may further include other suitable component(s) and/or structure(s). In some embodiments (as shown in FIG. 2 and FIG. 3), the flexible display apparatus 100 may include an adhering layer AL1 and an adhering layer AL2, wherein the sensor SN (e.g., the pen sensor PSN) may be adhered to the metal plate MB through the adhering layer AL2, and the display module DM may be adhered to the sensor SN (e.g., the pen sensor PSN) through the adhering layer AL1, but not limited thereto.

The flexible display apparatus 100 may be bent based on requirement(s). In some embodiments (as shown in FIG. 2 and FIG. 3), the first flexible area 100b of the flexible display apparatus 100 may be bent along the first bending axis 102b, so as to bend a portion of the sensor SN (e.g., the pen sensor PSN) and a portion of the display module DM to the second side MBb of the metal plate MB opposite to the first side MBa (i.e., the second side MBb is a side away from the display module DM), thereby forming the flexible display apparatus 100 shown in FIG. 3.

Therefore, in some embodiments (as shown in FIG. 3), a portion of the sensor SN (e.g., the sensing component 172) may be disposed at the first side MBa of the metal plate MB, and another portion of the sensor SN (e.g., the sensing driving component SD) may be disposed at the second side MBb of the metal plate MB due to the aforementioned bend. For instance, in the pen sensor PSN shown in FIG. 3, the touch pen sensing component 172p may be disposed at the first side MBa of the metal plate MB, and the second circuit board 180 of the sensing driving component SD may be disposed at the second side MBb of the metal plate MB. In some embodiments (as shown in FIG. 3), the second circuit board 180 of the sensing driving component SD may be adhered to the metal plate MB, such that the second circuit board 180 may be fixed at the second side MBb of the metal plate MB, but not limited thereto. Similarly, in some embodiments (as shown in FIG. 3), according to the aforementioned bend, a portion of the display module DM (e.g., the light emitting element 124, the optical layer 140, the cover layer 130) may be disposed at the first side MBa of the metal plate MB, and another portion of the display module DM (e.g., the display driving component DD) may be disposed at the second side MBb of the metal plate MB due to the aforementioned bend. For instance, the first circuit board 150 of the display driving component DD may be disposed at the second side MBb of the metal plate MB, but not limited thereto. In some embodiments, the first circuit board 150 of the display driving component DD may be adhered to the metal plate MB, such that the first circuit board 150 may be fixed at the second side MBb of the metal plate MB, but not limited thereto. According to some embodiments, as shown in FIG. 1, since a portion of the first circuit board 150 does not overlap a portion of the second circuit board 180, the first circuit board 150 may be adhered to the metal plate MB at a portion that does not overlap the second circuit board 180.

Regarding the bend of the first flexible area 100b of the flexible display apparatus 100, the bending structure of the first flexible area 100b may be designed based on requirement(s). In some embodiments (as shown in FIG. 3), a portion PORs of the sensing layer Ls may be bent to the second side MBb of the metal plate MB along the first bending axis 102b, and a portion PORd of the display module DM (e.g., a portion of the first flexible substrate 110 and/or a portion of the light emitting element 124) may be bent to the second side MBb of the metal plate MB along the first bending axis 102b, but not limited thereto. In some embodiments, the portion PORd of the display module DM may be overlapped with the sensing driving component SD.

In the present disclosure, since some structures of the flexible display apparatus 100 (e.g., the first circuit board 150 and the second circuit board 180) may be bent to the second side MBb of the metal plate MB, a non-display region (or a peripheral region) may be reduced, thereby reducing a horizontal size of the flexible display apparatus 100.

Moreover, in FIG. 3, the patterned portion 192a of the metal plate MB may be overlapped with the sensing layer Ls of the sensor SN and not be overlapped with the sensing driving component SD of the sensor SN. Or, the patterned portion 192a of the metal plate MB may not be overlapped with the sensing driving component SD of the sensor SN bent to the second side MBb of the metal plate MB. Namely, the second flexible area 100a may not be overlapped with the sensing driving component SD of the sensor SN (or not be overlapped with the sensing driving component SD of the sensor SN bent to the second side MBb of the metal plate MB), and thus, this sensing driving component SD may not influence the bend of the second flexible area 100a. For instance, the patterned portion 192a of the metal plate MB may not be overlapped with the second circuit board 180 of the sensor SN, but not limited thereto. Optionally, the patterned portion 192a of the metal plate MB may not be overlapped with the display driving component DD of the display module DM (or not be overlapped with the display driving component DD of the display module DM bent to the second side MBb of the metal plate MB). For instance, the patterned portion 192a of the metal plate MB may not be overlapped with the first circuit board 150 of the display module DM, but not limited thereto.

Figure 10:
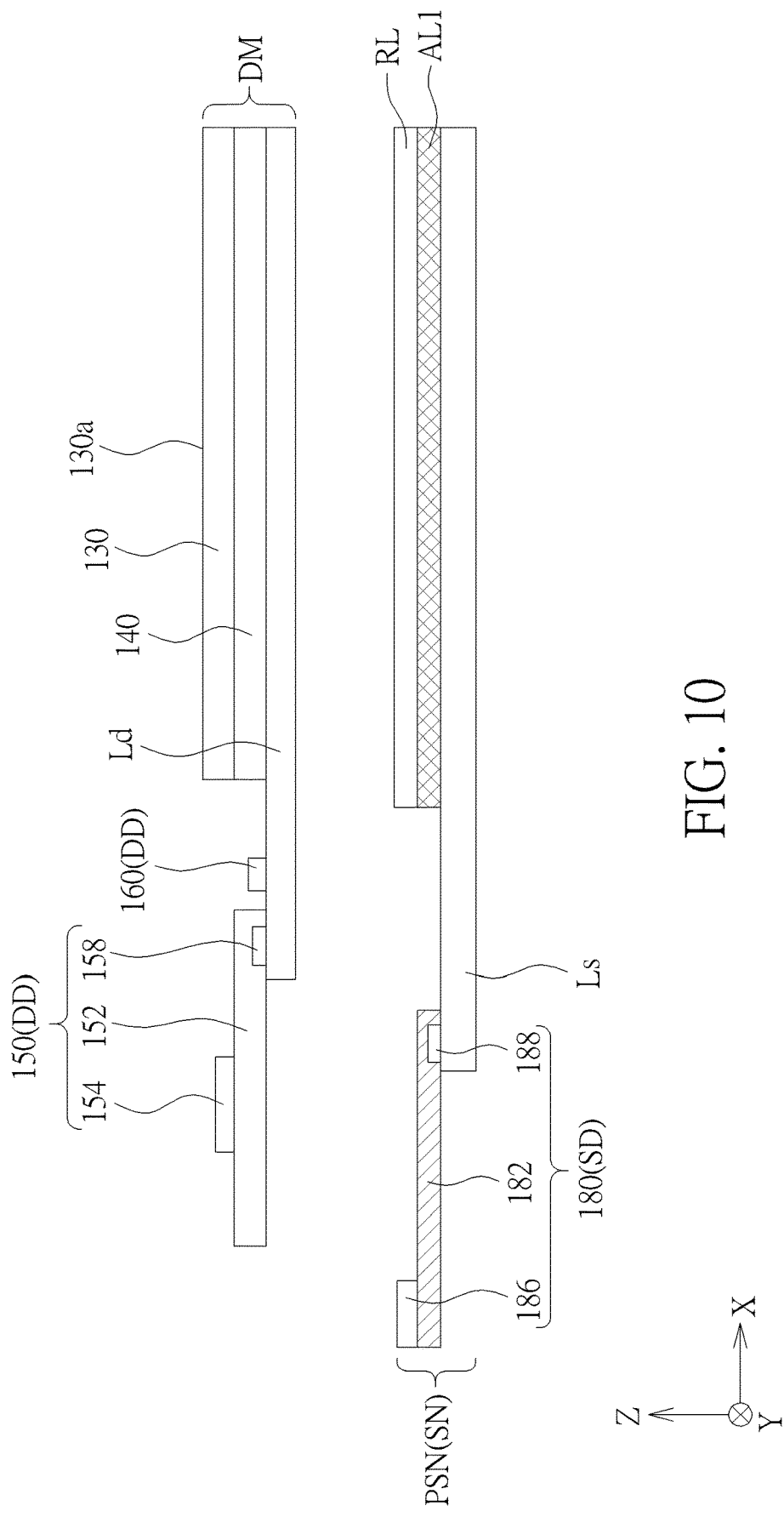
FIG. 10 and FIG. 11 are schematic diagrams illustrating structures at different stages in the forming process of the flexible display apparatus according to the first embodiment of the present disclosure.
Figure 11:
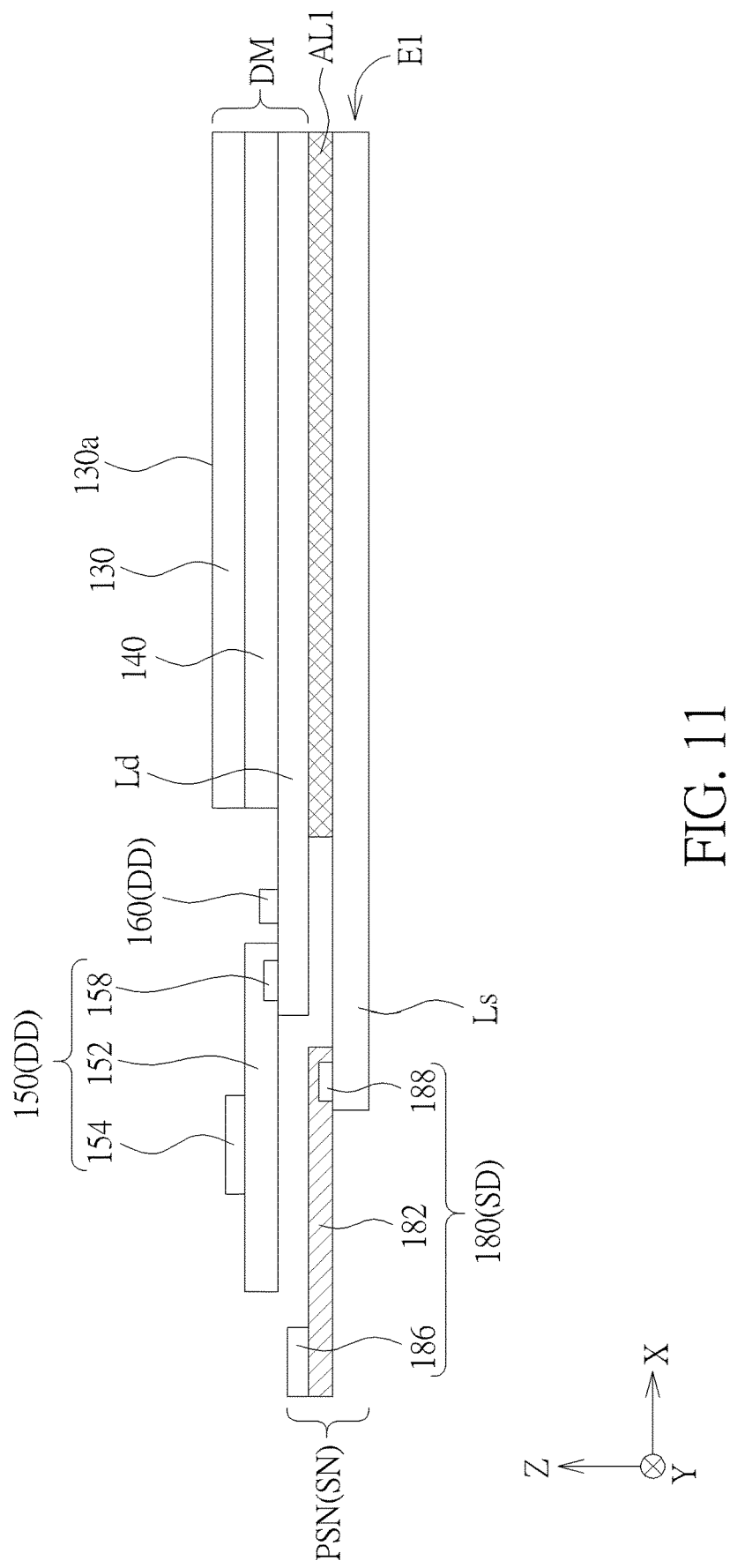
Figure 12:
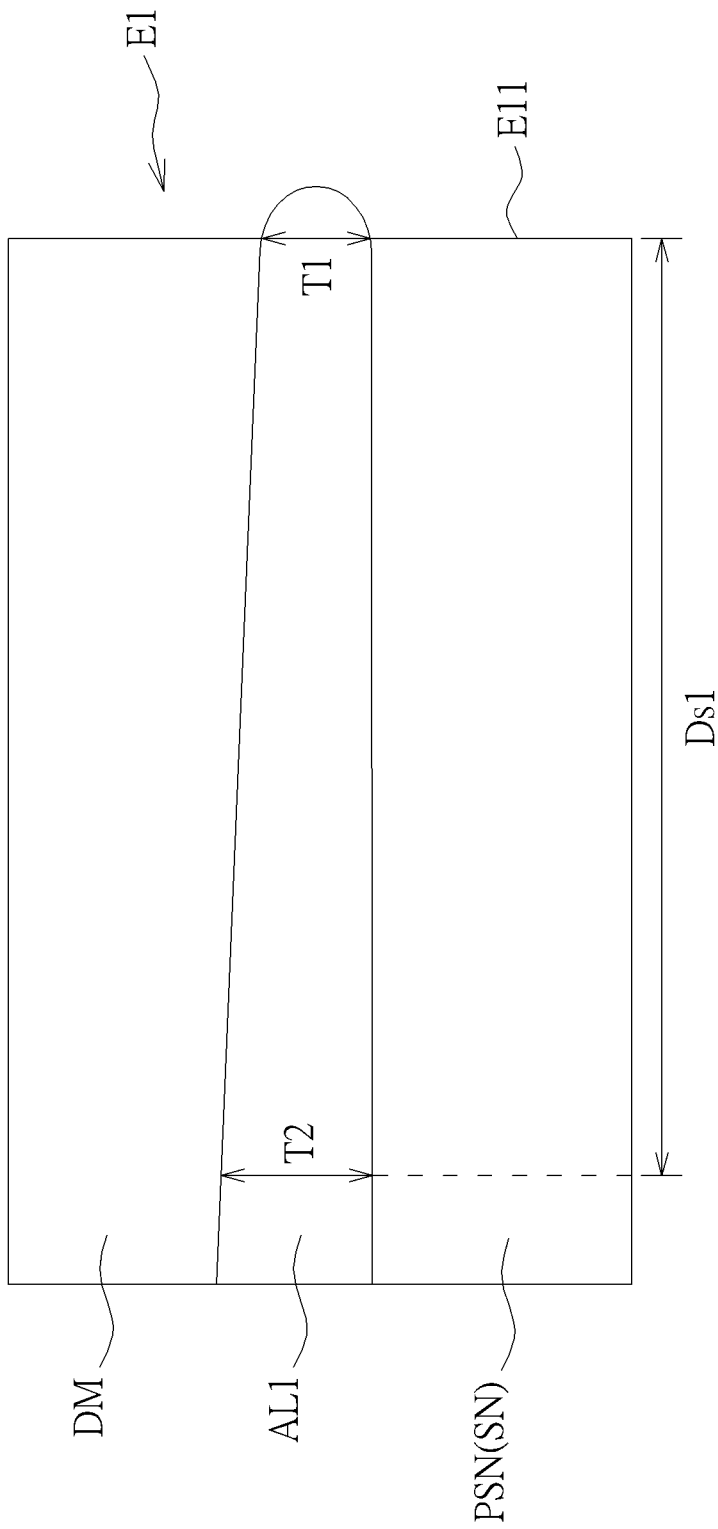
FIG. 12 is a schematic diagram showing a cross-sectional view of the display module and the sensor of the flexible display apparatus according to the first embodiment of the present disclosure.

Referring to FIG. 10 to FIG. 12, and simultaneously referring FIG. 1 to FIG. 3, FIG. 10 and FIG. 11 are schematic diagrams illustrating structures at different stages in the forming process of the flexible display apparatus 100 according to the first embodiment of the present disclosure, and FIG. 12 is a schematic diagram showing a cross-sectional view of the display module and the sensor of the flexible display apparatus according to the first embodiment of the present disclosure. As shown in FIG. 10, the display module DM and the sensor SN may be formed individually, and the adhering layer AL1 may be disposed on the sensor SN. For example, the adhering layer AL1 may be disposed on the sensing layer Ls of the sensor SN. In FIG. 10, a release film RL may be disposed on the adhering layer AL1, so as to protect the adhering layer AL1 and provide the supporting function of the sensor SN, thereby enhancing the yield rate of the sensor SN.

Then, as shown in FIG. 11, the release film RL is removed, and the sensor SN is adhered to the display module DM through the adhering layer AL1, wherein a pressure may be provided to make the adhering layer AL1 adhered between the sensor SN and the display module DM. For instance, during the adhesion of the sensor SN and the display module DM, a roller may be used to roll on the side of the sensor SN opposite to the adhering layer AL1, so as to adhere the sensor SN and the display module DM. In order to increase the adhering yield rate of the adhering layer AL1, and to decrease the possibility of the peeling of the sensor SN and the display module DM caused by the bend of the flexible display apparatus 100, the adhering force of the adhering layer AL1 at the edge of the sensor SN and/or the adhering force of the adhering layer AL1 at the edge of the display module DM should be enhanced. For instance, in FIG. 12, the roller may enhance the providing pressure at the edge of the sensor SN and/or at the edge of the display module DM, so as to enhance the adhering force of the adhering layer AL1 at the edge of the sensor SN and/or the adhering force of the adhering layer AL1 at the edge of the display module DM. In this case, as shown in FIG. 12, the thickness of the adhering layer AL1 at the edge of the sensor SN and/or the thickness of the adhering layer AL1 at the edge Ell of the display module DM may be less than the thickness of other portion of the adhering layer AL1. For instance, the adhering layer AL1 at the edge of the sensor SN and/or the adhering layer AL1 at the edge Ell of the display module DM may have a first thickness T1, and a position of the adhering layer AL1 at a distance Ds1 from the edge of the sensor SN and/or the edge Ell of the display module DM may have a second thickness T2, and the first thickness T1 may be less than the second thickness T2. For example, the distance Ds1 may range from 10 μm to 1 cm, but not limited thereto. For example, a ration of the first thickness T1 to the second thickness T2 may be greater than or equal to 0.5 and less than 1 (i.e., $0.5 \leq T1/T2 < 1$), but not limited thereto.

Afterwards, as shown in FIG. 2, the metal plate MB having the patterned portion 192a is adhered to the sensor SN (i.e., before the metal plate MB is adhered to the sensor SN, a pattern process is performed to form the patterned portion 192a). Then, as shown in FIG. 3, the first flexible area 100b of the flexible display apparatus 100 is bent.

The flexible display apparatus of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 13:
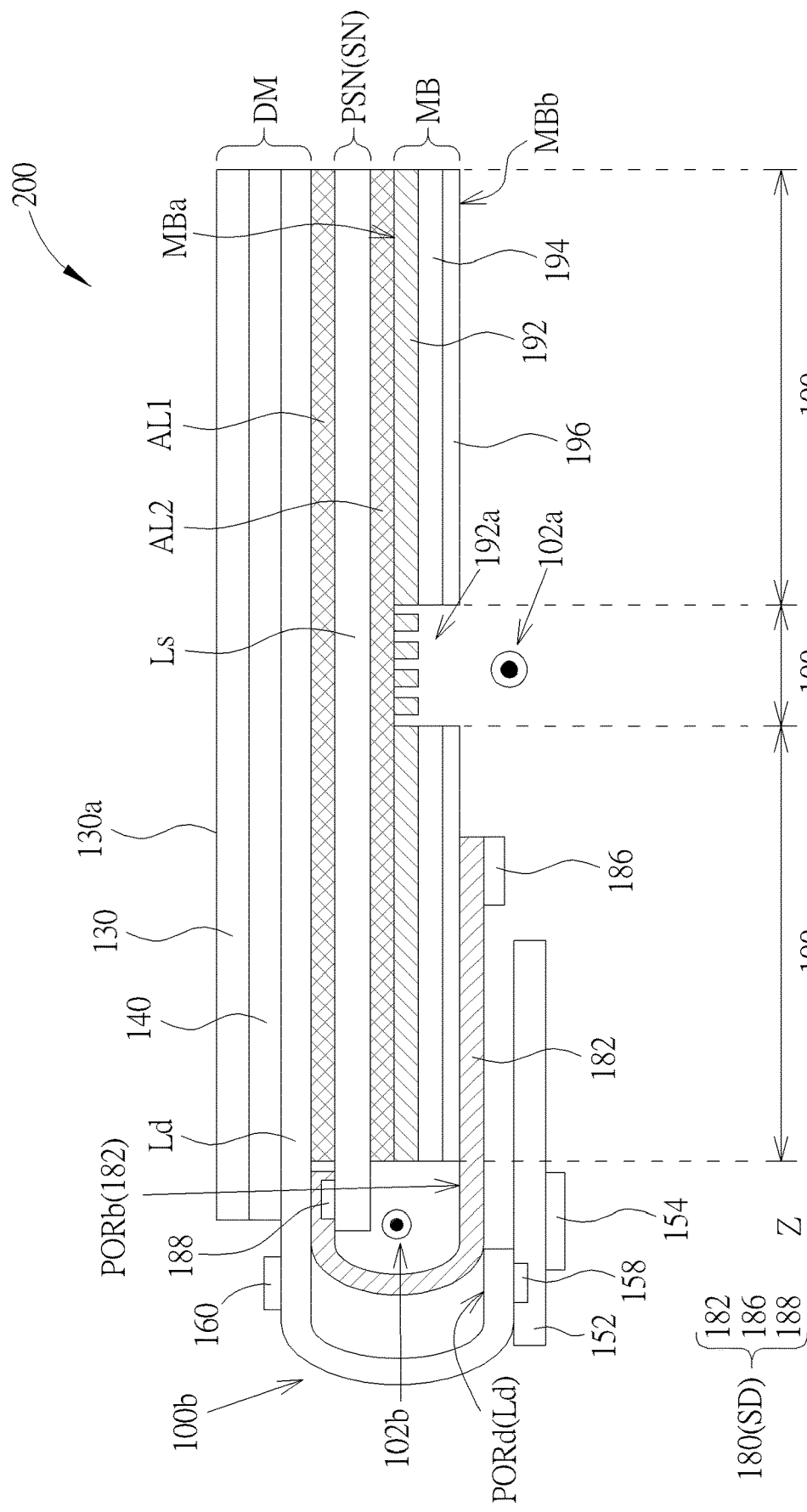
FIG. 13 is a schematic diagram showing a cross-sectional view of a flexible display apparatus according to a second embodiment of the present disclosure.

Referring to FIG. 13, FIG. 13 is a schematic diagram showing a cross-sectional view of a flexible display apparatus according to a second embodiment of the present disclosure. As shown in FIG. 13, a difference between this embodiment and the first embodiment is the design of the first flexible area 100b of the flexible display apparatus 200. In FIG. 13, the sensing layer Ls (e.g., the sensing component 172) of the sensor SN may not be disposed in the first flexible area 100b, and a portion PORb of the sensing driving component SD (e.g., the second circuit board 180) of the sensor SN may be disposed in the first flexible area 100b and be bent to the second side MBb of the metal plate MB along the first bending axis 102b, but not limited thereto. In this case, the second circuit board 180 may be a flexible printed circuit. The first bending axis 102b may be parallel to the second bending axis 102a of the second flexible area 100a. In some embodiments (not shown in figures), a portion of the display driving component DD (e.g., the first circuit board 150) of the display module DM may be bent to the second side MBb of the metal plate MB along the first bending axis 102b, but not limited thereto. Moreover, in some embodiments (as shown in FIG. 13), a portion of the first flexible substrate 110 situated in the first flexible area 100b may be bent, such that the first circuit board 150 and a portion of the first flexible substrate 110 may be bent to the second side MBb of the metal plate MB and may overlap the sensing driving component SD of the sensor SN (e.g., the second circuit board 180), but not limited thereto.

Optionally, in some embodiments (not shown in figures), the first flexible substrate 110 and the light emitting element 124 of the display module DM may not be disposed in the first flexible area 100b, and a portion of the display driving component DD (e.g., the first circuit board 150) of the display module DM may be disposed in the first flexible area 100b and be bent to the second side MBb of the metal plate MB along the first bending axis 102b, but not limited thereto. In this case, the first circuit board 150 may be a flexible printed circuit.

Figure 14:
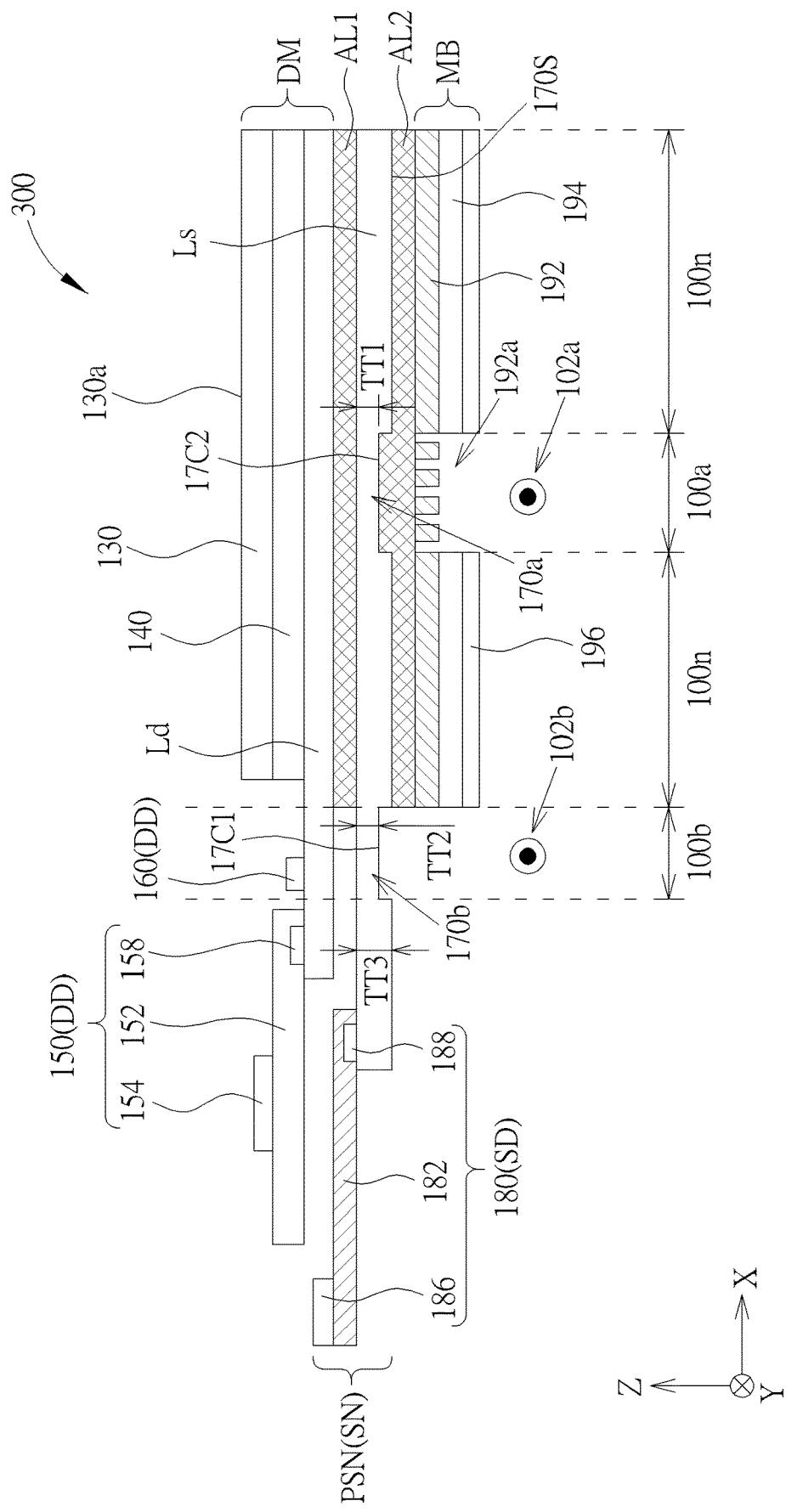
FIG. 14 is a schematic diagram showing a cross-sectional view of a flexible display apparatus according to a third embodiment of the present disclosure.

Referring to FIG. 14, FIG. 14 is a schematic diagram showing a cross-sectional view of a flexible display apparatus according to a third embodiment of the present disclosure. As shown in FIG. 14, a difference between this embodiment and the first embodiment is the design of the first flexible area 100b and/or the design of the second flexible area 100a of the flexible display apparatus 300. In FIG. 14, the sensor SN may have a thinned portion in the first flexible area 100b and/or a thinned portion in the second flexible area 100a, so as to advantageously bend of the first flexible area 100b and/or the second flexible area 100a.

In some embodiments, as shown in FIG. 14, the sensing layer Ls of the sensor SN may have a first thinned portion 170b around the first bending axis 102b. The sensing layer Ls may have a second thinned portion 170a overlapped with the patterned portion 192a of the metal plate MB. According to some embodiments, the first thinned portion 170b may be in the first flexible area 100b, and the second thinned portion 170a may be in the second flexible area 100a, but not limited thereto. In FIG. 14, a thickness TT2 of the first thinned portion 170b may be less than a thickness TT3 of other position of the sensing layer Ls (e.g., a position in the non-flexible area 100n). A thickness TT1 of the second thinned portion 170a may be less than a thickness TT3 of other position of the sensing layer Ls (e.g., a position in the non-flexible area 100n). In some embodiments, in FIG. 14, a recess 17C2 may be formed on a bottom surface 170S of the sensing layer Ls to form the second thinned portion 170a of the sensing layer Ls, and the adhering layer AL2 may be filled in this recess 17C2, but not limited thereto. According to some embodiments, a recess 17C1 may be formed on the bottom surface 170S of the sensing layer Ls to form the first thinned portion 170b of the sensing layer Ls. The aforementioned bottom surface 170S of the sensing layer Ls may be a bottom surface of the second flexible substrate 170 (as shown in FIG. 6). Namely, the recess 17C1 and the recess 17C2 may be formed on the bottom surface 170S of the second flexible substrate 170. According to some embodiments, the thickness TT2 of the first thinned portion 170b may be the same as or different from the thickness TT1 of the second thinned portion 170a.

Optionally, the display module DM may have a thinned portion in the second flexible area 100a and/or a thinned portion in the first flexible area 100b, and the design of the thinned portion of the display module DM may be similar to the design of the thinned portion of the sensor SN, but not limited thereto.

Figure 15:
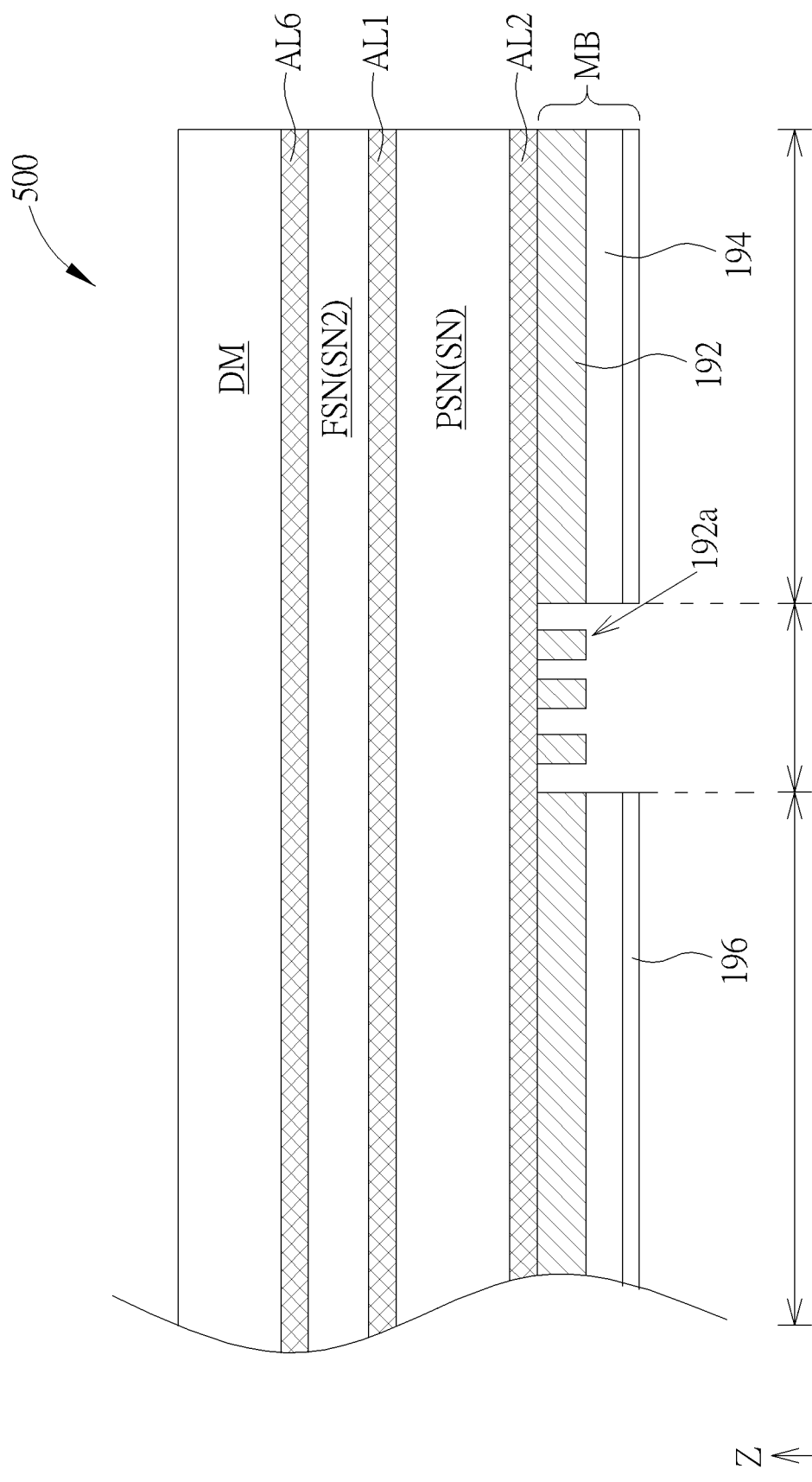
FIG. 15 is a schematic diagram showing a cross-sectional view of a flexible display apparatus according to a fourth embodiment of the present disclosure.
Figure 16:
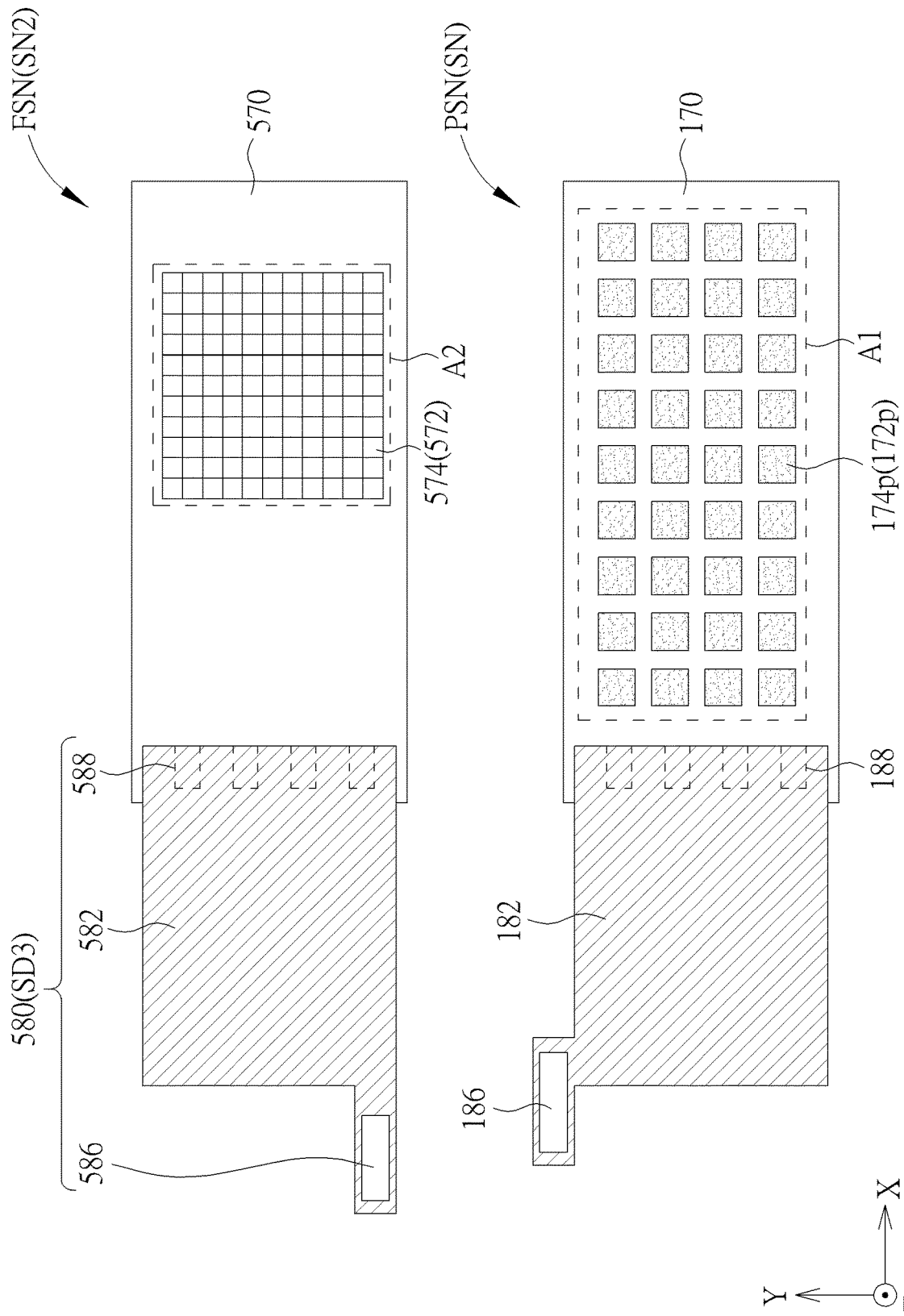
FIG. 16 is a schematic diagram showing a top view of the sensor of the flexible display apparatus according to the fourth embodiment of the present disclosure.

Referring to FIG. 15 and FIG. 16, FIG. 15 is a schematic diagram showing a cross-sectional view of a flexible display apparatus according to a fourth embodiment of the present disclosure, and FIG. 16 is a schematic diagram showing a top view of the sensor of the flexible display apparatus according to the fourth embodiment of the present disclosure. As shown in FIG. 15 and FIG. 16, a difference between this embodiment and the first embodiment is that the flexible display apparatus 500 of this embodiment further includes another sensor SN2 addition to the pen sensor PSN. The sensor SN2 may be disposed between the pen sensor PSN and the display module DM. According to some embodiments, the sensor SN2 may be a fingerprint sensor FSN. According to some embodiments, the sensor SN2 may be a touch sensor.

For the convenience of explanation, the sensor SN2 is the fingerprint sensor FSN as an example for explaining exemplarily in the following, but the present disclosure is not limited thereto. The type of the fingerprint sensor FSN can be referred to the above. In FIG. 15, the fingerprint sensor FSN may be disposed between the pen sensor PSN and the display module DM, but not limited thereto. Note that, if the pen sensor PSN is disposed between the fingerprint sensor FSN and the display module DM, the sensing of the fingerprint sensor FSN may be shielded by the pen sensor PSN.

The fingerprint sensor FSN may include a third flexible substrate 570, a fingerprint sensing component 572 and a fingerprint sensing driving component SD3 electrically connected to the fingerprint sensing component 572. In the present disclosure, the third flexible substrate 570 may include any suitable flexible material, such as PI, PET, UTG, silicon oxide, other suitable material(s) or a combination thereof, but not limited thereto.

The fingerprint sensing component 572 may include a plurality of fingerprint sensing units 574, and the detail of the fingerprint sensing unit 574 can be referred to the above. The fingerprint sensing driving component SD3 may include a third circuit board 580 disposed on the third flexible substrate 570 of the fingerprint sensor FSN. A board body 582 of the third circuit board 580 may be a rigid board body or a flexible board body, such that the third circuit board 580 may be a rigid printed circuit or a flexible printed circuit (FPCB) based on requirement(s). For instance, the third circuit board 580 may include any suitable electronic component (e.g., a bonding pad 588, a trace, a chip, a connecting element 586, etc.) disposed on the flexible board body 582, such that the third circuit board 580 may be a flexible printed circuit assembly (FPCA), but not limited thereto. In some embodiments, the third circuit board 580 may be connected to the third flexible substrate 570 through a solder, and the third circuit board 580 may be electrically connected to the electronic component of the fingerprint sensor FSN through the bonding pad 588, the solder and the bonding pad (not shown in figures) of the third flexible substrate 570. For instance, the chip of the third circuit board 580 may drive the fingerprint sensing component 572 (e.g., the fingerprint sensing unit 574) of the fingerprint sensor FSN, but not limited thereto. The connecting element 586 of the third circuit board 580 may be configured to be connected to an outer device (e.g., a voltage source not shown in figures), but not limited thereto.

In FIG. 16, for the convenience of explanation, the fingerprint sensor FSN and the pen sensor PSN are shown separately. Note that, in the flexible display apparatus 500, the actually disposition of the fingerprint sensor FSN and the pen sensor PSN are shown FIG. 15. Therefore, referring to FIG. 16 and making the fingerprint sensor FSN be disposed on the pen sensor PSN in the third direction (the direction Z), similarly to FIG. 1, under the condition that the flexible display 100 is bent or not bent, the first circuit board 150 of the display module DM, the second circuit board 180 of the pen sensor PSN and the third circuit board 580 of the fingerprint sensor FSN may partially overlap with each other in the top view. The connecting element 156 of the first circuit board 150, the connecting element 186 of the second circuit board 180 and the connecting element 586 of the third circuit board 580 may be misaligned with each other. In FIG. 16, the connecting element 186 of the second circuit board 180 may not overlap the third circuit board 580, the connecting element 586 of the third circuit board 580 may not overlap the second circuit board 180, but not limited thereto.

In FIG. 15, the fingerprint sensor FSN may be adhered to the display module DM through an adhering layer AL6 and be adhered to the pen sensor PSN through the adhering layer AL1, but not limited thereto. In some embodiments, the display module DM may include the supporting layer SF shown in FIG. 4, and thus, the fingerprint sensor FSN may be adhered to the supporting layer SF of the display module DM through the adhering layer AL6, but not limited thereto. In some embodiments, the display module DM may not include the supporting layer SF shown in FIG. 4, and thus, the fingerprint sensor FSN may be adhered to the first flexible substrate 110 of the display module DM through the adhering layer AL6, such that the fingerprint sensor FSN may not only perform the sensing function but also have the function of supporting the first flexible substrate 110 of the display module DM.

The sensing area A1 of the pen sensor PSN and the sensing area A2 of the fingerprint sensor FSN may be designed based on requirement(s). In the present disclosure, the sensing area of the sensor is an area of the sensing region of the sensor. Namely, the sensor may perform the sensing function in this sensing region. In some embodiments (as shown in FIG. 16), the sensing area A1 of the pen sensor PSN may be greater than the sensing area A2 of the fingerprint sensor FSN, but not limited thereto. For example, the sensing area A1 of the pen sensor PSN may be similar to or the same as the display area of the flexible display apparatus 500, and the sensing area A2 of the fingerprint sensor FSN may be the same as an area of a button, but not limited thereto. The aforementioned sensing area may be an area measuring in the top-view direction of the flexible display apparatus. Namely, as shown in FIG. 16, the sensing area A1 of the pen sensor PSN and the sensing area A2 of the fingerprint sensor FSN may be areas measuring on a XY plane formed by the first direction (the direction Y) and the second direction (the direction X).

The resolution of the pen sensor PSN and the resolution of the fingerprint sensor FSN may be designed based on requirement(s). In some embodiments (as shown in FIG. 16), the resolution of the pen sensor PSN may be less than the resolution of the fingerprint sensor FSN, but not limited thereto. For instance, in a unit area (e.g., an area with 2 cm×2 cm), the number of the touch pen sensing unit (s) $174p$ of the pen sensor PSN may be less than the number of the fingerprint sensing unit(s) 574 of the fingerprint sensor FSN, but not limited thereto.

Figure 17:
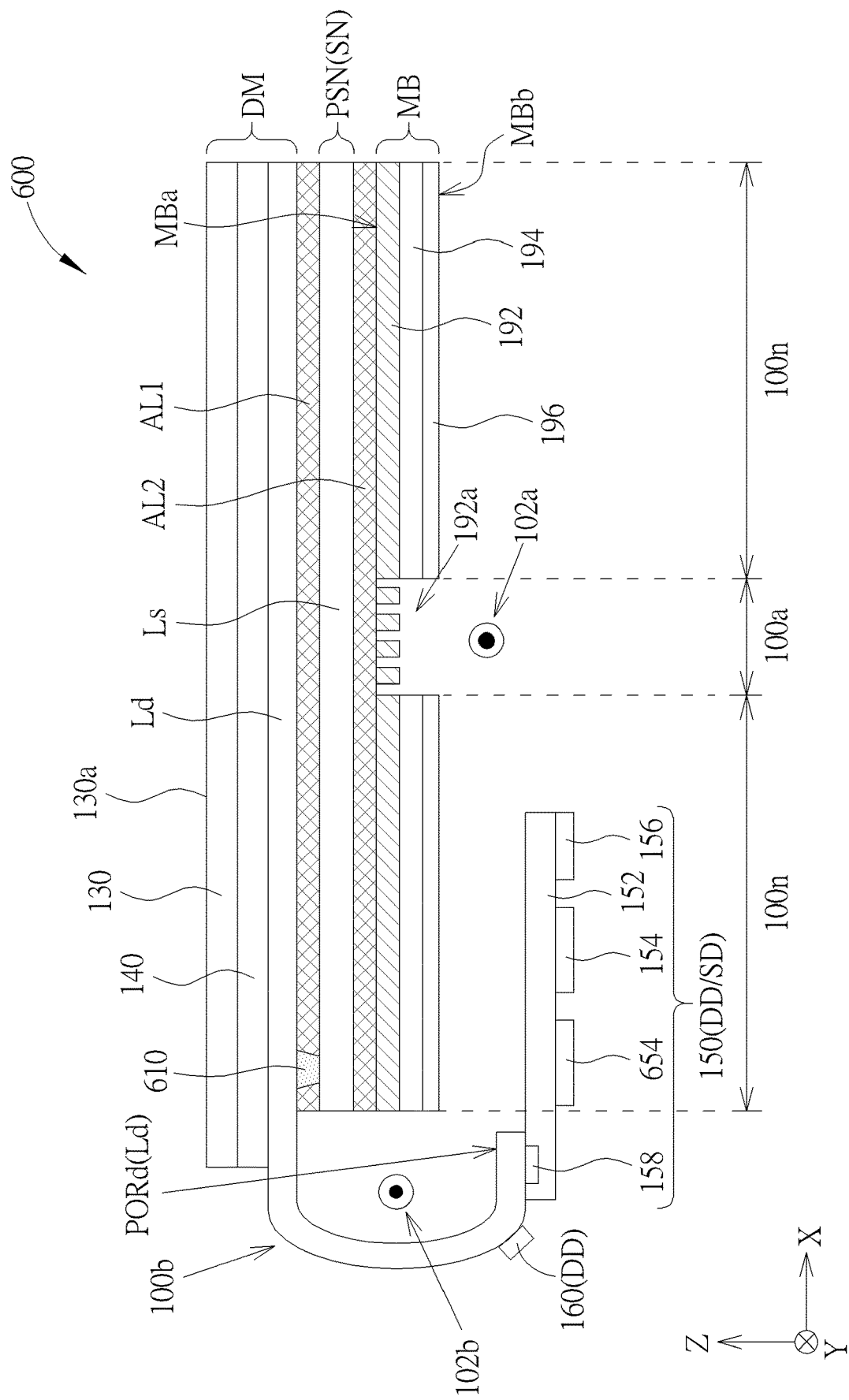
FIG. 17 and FIG. 18 are schematic diagrams showing a cross-sectional view of a flexible display apparatus according to a fifth embodiment of the present disclosure.
Figure 18:
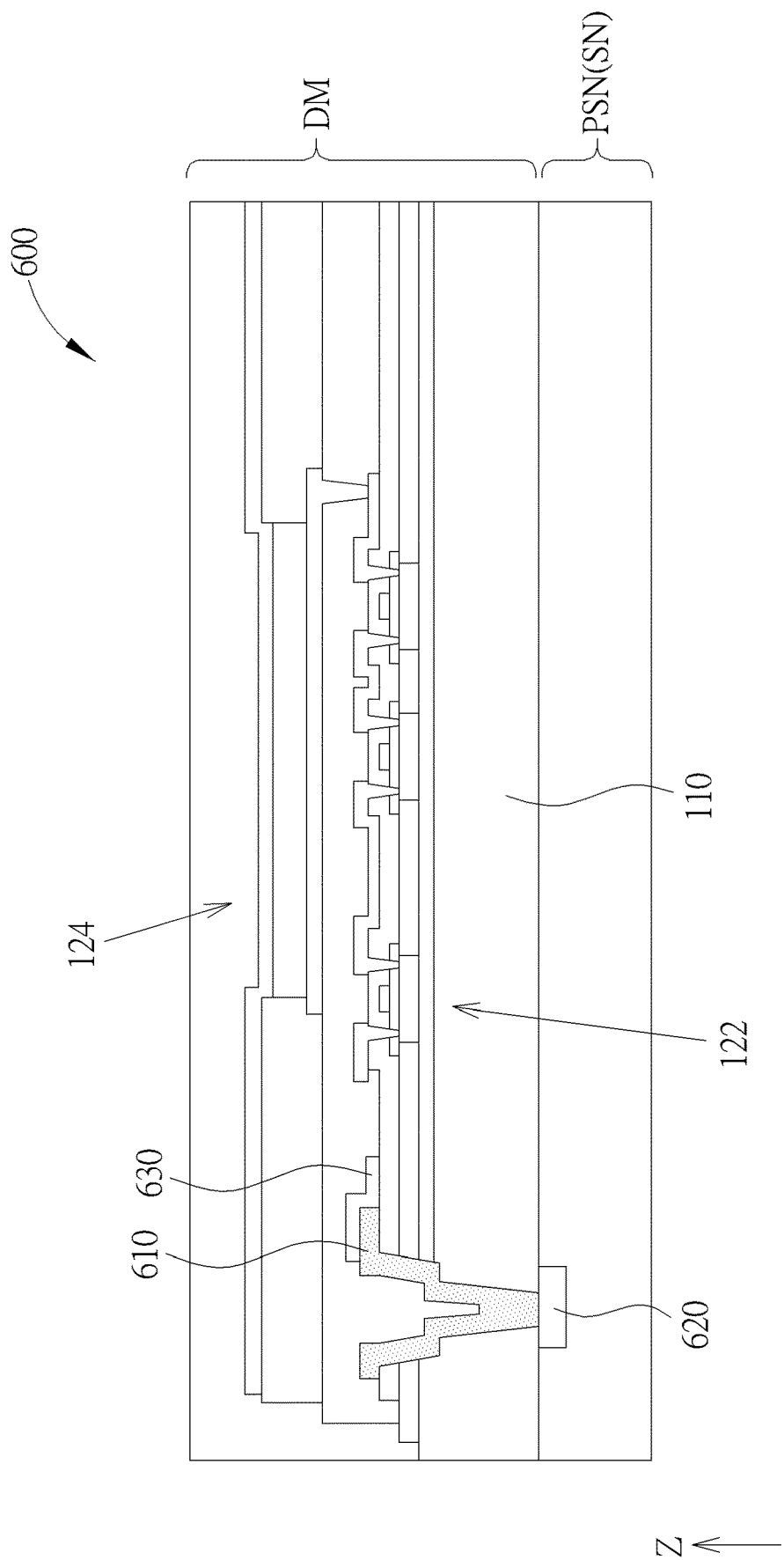

Referring to FIG. 17 and FIG. 18, FIG. 17 and FIG. 18 are schematic diagrams showing a cross-sectional view of a flexible display apparatus according to a fifth embodiment of the present disclosure. As shown in FIG. 17 and FIG. 18, a difference between this embodiment and the first embodiment is the design of the driving component in the flexible display apparatus 600. In FIG. 17 and FIG. 18, the flexible display apparatus 600 may include the first circuit board 150 and not include the second circuit board 180, and the electronic component of the first circuit board 150 may be electrically connected to the sensing component 172 of the sensor SN and the light emitting element 124 of the display module DM, such that the first circuit board 150 may simultaneously drive the sensing component 172 of the sensor SN and the light emitting element 124 of the display module DM. That is to say, the display driving component DD of the display module DM may include at least a portion of the first circuit board 150, and the sensing driving component SD of the sensor SN may include at least a portion of the first circuit board 150. Therefore, the first circuit board 150 may include a chip 154 configured to drive the light emitting element 124 of the display module DM, and the first circuit board 150 may include a chip 654 configured to drive the sensing component 172. According some embodiments, the chip 154 and the chip 654 may be integrated into a single chip configured to simultaneously drive the light emitting element 124 and the sensing component 172.

In FIG. 17 and FIG. 18, the flexible display apparatus 600 may include a conductive connecting structure 610, and the sensing component 172 of the sensor SN may be electrically connected to the first circuit board 150 through the conductive connecting structure 610. For instance, in FIG. 17 and FIG. 18, the conductive connecting structure 610 may be connected between a trace 630 of the display module DM and a trace 620 of the sensor SN, and therefore, the conductive connecting structure 610 may pass through the first flexible substrate 110 of the display module DM, but not limited thereto.

Figure 19:
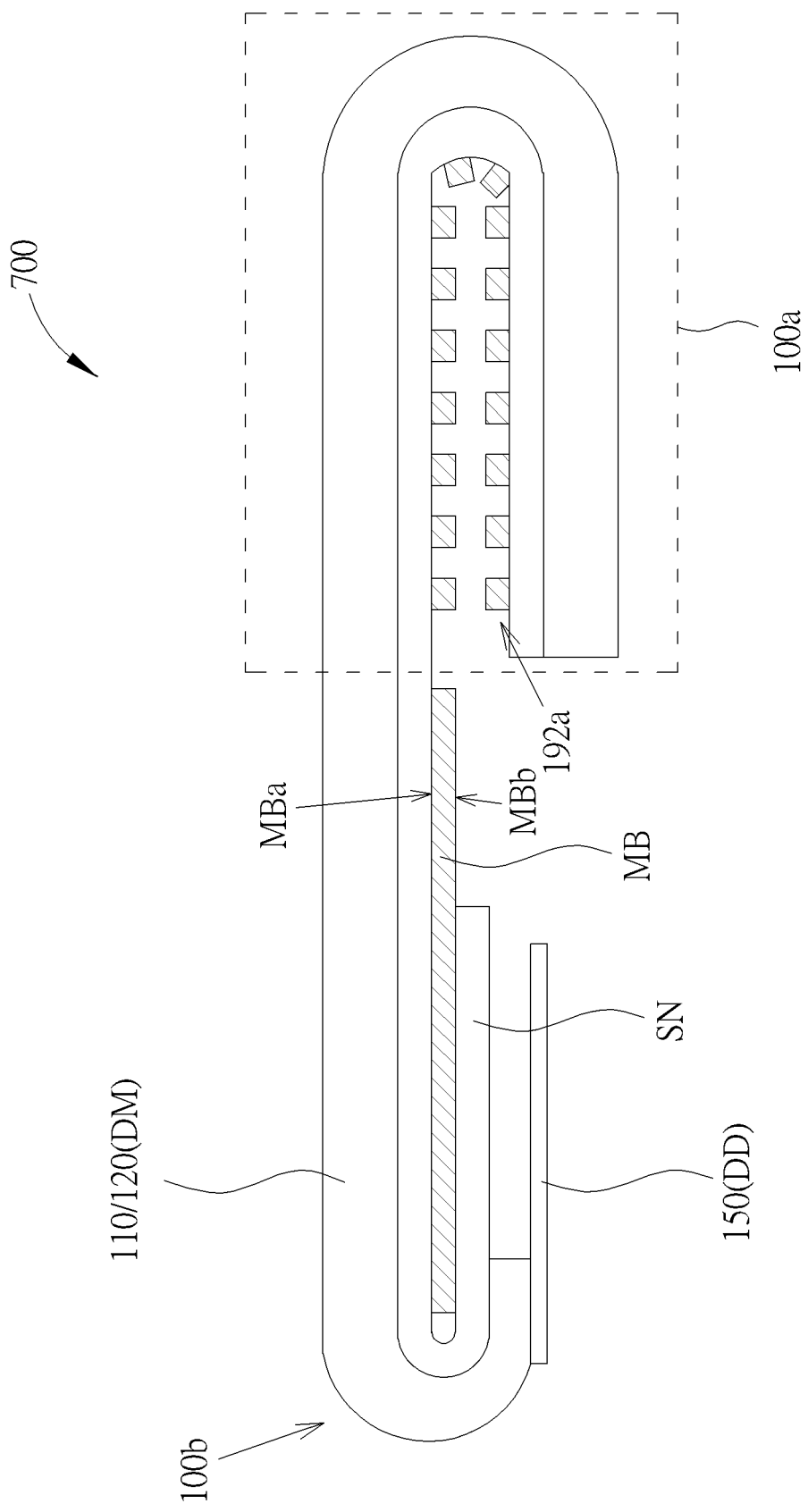
FIG. 19 is a schematic diagram showing a cross-sectional view of a flexible display apparatus according to a sixth embodiment of the present disclosure.

Referring to FIG. 19, FIG. 19 is a schematic diagram showing a cross-sectional view of a flexible display apparatus according to a sixth embodiment of the present disclosure, wherein FIG. 19 simplifies the sensor SN to a single layer structure, but the detail of the sensor SN can be referred to the above. As shown in FIG. 19, a difference between this embodiment and the first embodiment is the bending design of the flexible display apparatus 700. In FIG. 19, the second flexible area 100*a* may extend to the edge of the flexible display apparatus 700, such that the non-flexible area 100*n* may be disposed on one side of the second flexible area 100*a*. In some embodiments (as shown in FIG. 19), the second flexible area 100*a* may be a foldable area or a rollable area, the first flexible area 100*b* may be a foldable area, such that the flexible display apparatus 700 may be a foldable display device or a stretchable display device, but not limited thereto.

Figure 20:
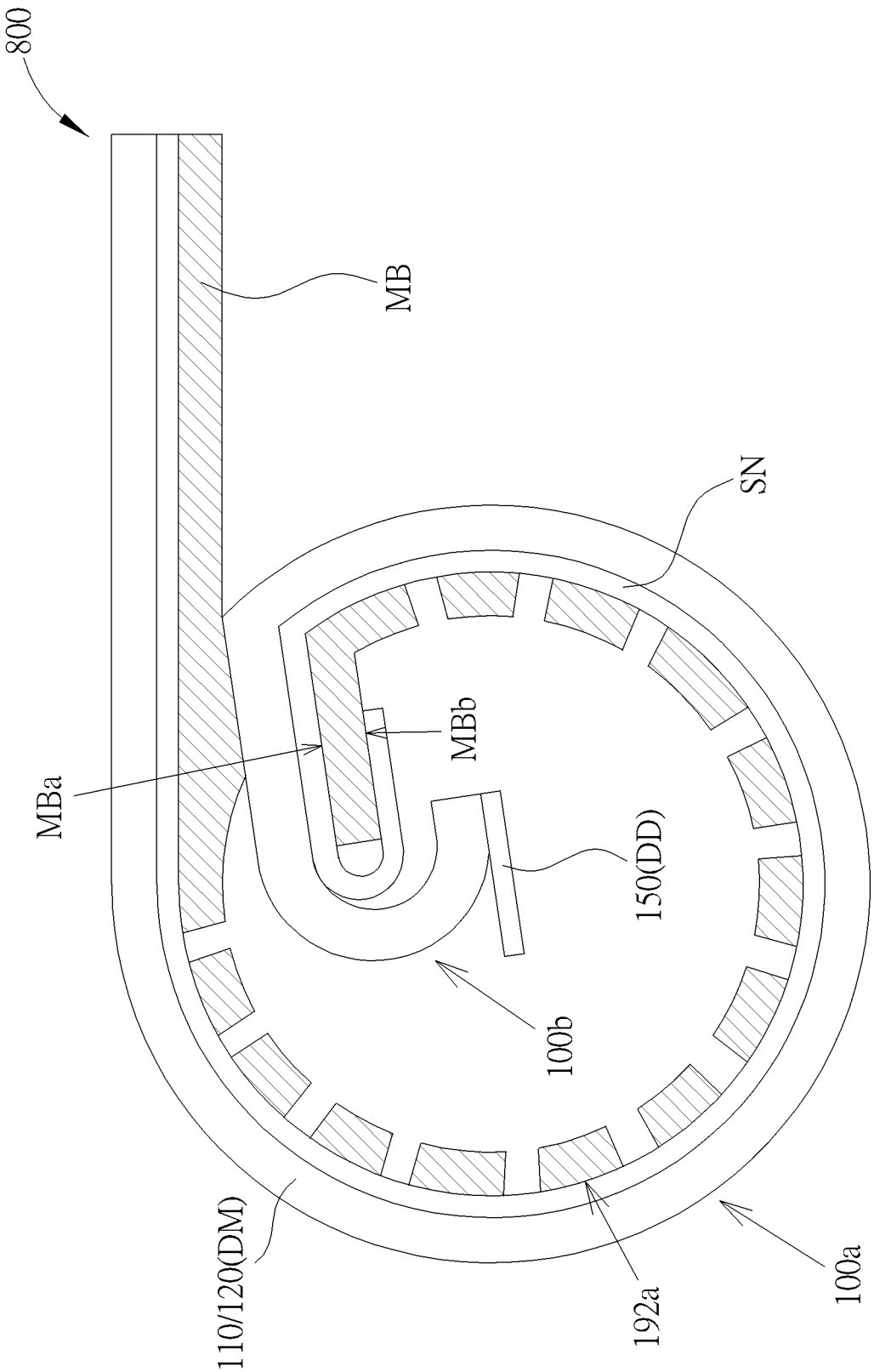
FIG. 20 is a schematic diagram showing a cross-sectional view of a flexible display apparatus according to a seventh embodiment of the present disclosure.

Referring to FIG. 20, FIG. 20 is a schematic diagram showing a cross-sectional view of a flexible display apparatus according to a seventh embodiment of the present disclosure, wherein FIG. 20 simplifies the sensor SN to a single layer structure, but the detail of the sensor SN can be referred to the above. As shown in FIG. 20, a difference between this embodiment and the first embodiment is the bending design of the flexible display apparatus 800. In FIG. 20, the second flexible area 100*a* may be a rollable area, such that the second flexible area 100*a* may be bent into a ring shape. In this case, the flexible display apparatus 800 may be a rollable display device, but not limited thereto.

In summary, according to the design of the flexible display apparatus of the present disclosure, the sensor has the sensing layer and the sensing driving component, wherein the sensing layer is disposed at the first side of the metal plate close to the display module, and the sensing driving component is disposed at the second side of the metal plate. According to some embodiments, a condition that the signal of the sensing layer is shielded by the metal plate can be prevented, and the narrow-border effect can be achieved.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flexible display apparatus, comprising:
   a display module having a flexible region;
   a metal plate comprising a patterned portion overlapped with the flexible region, wherein the metal plate has a first side and a second side opposite to the first side, and at least a portion of the display module is disposed on the first side of the metal plate; and
   a sensor comprising a sensing layer and a sensing driving component,
   wherein at least a portion of the sensing layer is disposed on the first side of the metal plate, at least a portion of the sensing driving component is disposed on the second side of the metal plate, and the sensing driving component is electrically connected to the sensing layer,
   wherein the sensor is a pen sensor, and the sensing layer comprises a plurality of digitizer sensors.

2. The flexible display apparatus according to claim 1, wherein a portion of the sensing layer is bent to the second side of the metal plate along a first bending axis.

3. The flexible display apparatus according to claim 2, wherein the flexible region of the display module is capable of being bent along a second bending axis, and the first bending axis is parallel to the second bending axis.

4. The flexible display apparatus according to claim 2, wherein the sensing layer has a first thinned portion around the first bending axis.

5. The flexible display apparatus according to claim 1, wherein a portion of the sensing driving component is bent to the second side of the metal plate along a first bending axis.

6. The flexible display apparatus according to claim 5, wherein the flexible region of the display module is capable of being bent along a second bending axis, and the first bending axis is parallel to the second bending axis.

7. The flexible display apparatus according to claim 1, wherein a portion of the display module is bent to the second side of the metal plate and is overlapped with the sensing driving component.

8. The flexible display apparatus according to claim 1, wherein the patterned portion of the metal plate is overlapped with the sensing layer and is not overlapped with the sensing driving component.

9. The flexible display apparatus according to claim 1, wherein the sensing layer has a second thinned portion overlapped with the patterned portion of the metal plate.

10. The flexible display apparatus according to claim 1, wherein the patterned portion of the metal plate comprises a plurality of slits.

11. The flexible display apparatus according to claim 1, further comprising a fingerprint sensor disposed between the pen sensor and the display module.

12. The flexible display apparatus according to claim 11, wherein a sensing area of the pen sensor is greater than a sensing area of the fingerprint sensor.

13. The flexible display apparatus according to claim 11, wherein in a unit area, a number of pen sensing units of the pen sensor is less than a number of fingerprint sensing units of the fingerprint sensor.

14. The flexible display apparatus according to claim 1, wherein the sensing driving component comprises a flexible printed circuit.

15. The flexible display apparatus according to claim 1, wherein the flexible region is a rollable region.

16. The flexible display apparatus according to claim 1, wherein the flexible region is a foldable region.

17. The flexible display apparatus according to claim 1, wherein the display module comprises a flexible substrate and a plurality of light emitting elements disposed on the flexible substrate, and the sensor is adhered to the flexible substrate.

18. The flexible display apparatus according to claim 1, wherein the sensing layer comprises a plurality of sensing components, and at least a portion of the plurality of sensing components are disposed on the second side of the metal plate.

\* \* \* \* \*